(12) United States Patent
Cok et al.

(10) Patent No.: US 8,739,399 B2
(45) Date of Patent: Jun. 3, 2014

(54) MAKING ELECTRONIC STORAGE SYSTEM HAVING CODE CIRCUIT

(75) Inventors: Ronald Steven Cok, Rochester, NY (US); Christopher Lyons, West Chester, PA (US)

(73) Assignee: Eastman Kodak Company, Rochester, NY (US)

( * ) Notice: Subject to any disclaimer, the term of this patent is extended or adjusted under 35 U.S.C. 154(b) by 70 days.

(21) Appl. No.: 13/455,377

(22) Filed: Apr. 25, 2012

(65) Prior Publication Data

US 2013/0283599 A1    Oct. 31, 2013

(51) Int. Cl.
*H05K 3/30*    (2006.01)

(52) U.S. Cl.
USPC ............... 29/832; 29/825; 29/830; 29/846; 361/737

(58) Field of Classification Search
USPC ............ 29/825, 830, 832, 840, 846; 361/737
See application file for complete search history.

(56) References Cited

U.S. PATENT DOCUMENTS

| | | | |
|---|---|---|---|
| 5,381,014 A | 1/1995 | Jeromin et al. | |
| 6,236,316 B1 | 5/2001 | Eberhardt et al. | |
| 6,606,247 B2 * | 8/2003 | Credelle et al. | 361/737 |
| 6,980,184 B1 * | 12/2005 | Stewart et al. | 345/87 |
| 6,982,425 B1 | 1/2006 | Rougeot et al. | |
| 7,268,680 B2 | 9/2007 | Gary, Jr. | |
| 7,533,361 B2 | 5/2009 | Edwards | |
| 7,692,157 B2 | 4/2010 | Rougeot et al. | |
| 2005/0000634 A1 * | 1/2005 | Craig et al. | 156/230 |
| 2007/0013521 A1 * | 1/2007 | Lindsay et al. | 340/572.1 |
| 2007/0152829 A1 * | 7/2007 | Lindsay et al. | 340/572.3 |
| 2008/0204238 A1 | 8/2008 | White | |
| 2011/0210176 A1 | 9/2011 | King | |
| 2011/0260834 A1 | 10/2011 | Chapman et al. | |

FOREIGN PATENT DOCUMENTS

WO    2007/089322    8/2007

OTHER PUBLICATIONS

IMEC News (web site), European project reaches milestone bidirectional communication for thin-film RFIDs, enabling item-level RFID tags, Feb. 22, 2012, San Francisco, USA (http://www2.imec.be/be_en/press/imec-news/issccrfid.html).

* cited by examiner

*Primary Examiner* — Carl Arbes

(74) *Attorney, Agent, or Firm* — Christopher J. White; Raymond L. Owens

(57) ABSTRACT

A method of making an electronic storage system includes receiving a substrate and a circuit template. A transceiver including a transceiver substrate separate from the substrate is disposed over the substrate. The transceiver includes an output electrical-connection pad, and a plurality of input electrical-connection pads. A circuit template is disposed over the substrate so that at least one of the conductors of the circuit template is electrically connected to the output pad and at least one of the conductors of the circuit template is electrically connected to each of the input pads. At least one electrically-conductive strap is printed over the substrate so that each strap electrically connects the output pad to the at least one of the input pads through at least two of the conductors of the circuit template.

13 Claims, 22 Drawing Sheets

MAKING ELECTRONIC STORAGE SYSTEM HAVING CODE CIRCUIT

CROSS REFERENCE TO RELATED APPLICATIONS

Reference is made to commonly assigned U.S. application Ser. No. 13/455,167, filed concurrently herewith, titled "ELECTRONIC STORAGE SYSTEM WITH CODE CIRCUIT;" U.S. application Ser. No. 13/455,257, filed concurrently herewith, titled "ELECTRONIC STORAGE SYSTEM WITH EXTERNALLY-ALTERABLE CONDUCTOR;" U.S. application Ser. No. 13/455,367, filed concurrently herewith, titled "ALTERING CONDUCTOR IN ELECTRONIC STORAGE SYSTEM;" U.S. application Ser. No. 13/455,360, filed concurrently herewith, titled "ELECTRONIC STORAGE SYSTEM WITH ENVIRONMENTALLY-ALTERABLE CONDUCTOR;" U.S. application Ser. No. 13/455,390, filed concurrently herewith, titled "MAKING STORAGE SYSTEM HAVING ENVIRONMENTALLY-MODIFIABLE CONDUCTOR;" and U.S. application Ser. No. 13/455,402, filed concurrently herewith, titled "MAKING STORAGE SYSTEM HAVING MODIFIABLE CONDUCTOR AND MEMORY," the disclosures of which are incorporated by reference herein in their entirety.

FIELD OF THE INVENTION

The present invention relates to storing data, particularly non-volatile information.

BACKGROUND OF THE INVENTION

Package identification is a well-known method for inventory control. By providing a way to identify a specific package, manufacturers can track the construction process of a product, shippers can track a package from one location to another, and vendors can track the location of products. Bar codes are one established method for identifying products and the containers in which products are transported. Another established technology for identifying and tracking products is radio-frequency identification (RFID). RFID tags can include passive circuits in an integrated circuit (IC) that respond to a radio signal with stored identification or other data. The radio signal is provided by a "reader" (or "interrogator") that commands the tag to transmit its stored data. U.S. Patent Publication No. 2008/0204238 describes a variety of RFID-enabled devices. In this publication, the term "downlink" refers to communications from a reader to an RFID tag. The term "uplink" refers to communications from a tag to a reader.

RFID devices are also used for monitoring purposes, e.g., as disclosed in U.S. Pat. No. 7,268,680. This patent describes a tag unit having a transmitting unit coupled to wearable electronic banding material. An RFID unit with a writeable memory is coupled to the transmitting unit. The band can include one or more conductors (which can be an antenna) that complete an electronic circuit. A layer of the band can include the RFID tag IC. The RFID tag can be read to determine that it is operational. The tag can also return data indicating whether the band is still connected to the tag IC.

Capacitively coupled RFID readers, for example as described in U.S. Pat. No. 6,236,316, electrically communicate with an identification tag to receive a unique digital code containing data relating to an object to which the identification tag is secured. The identification tag contains a transponder circuit that contains the unique digital code. The transponder circuits are typically constructed from integrated circuits and can be expensive for the intended tracking purpose. Moreover, the unique digital code is programmed into an IC on the tag in a silicon wafer fab, e.g., by laser-trimming each IC die before it is encapsulated. Since wafer processes are designed to produce large numbers of identical ICs, uniqueness requires a significant investment in programming equipment and in workflow equipment and processes to manage the ICs and guarantee uniqueness of the IDs.

U.S. Pat. No. 7,533,361 discloses a system and process for combining printable electronics with traditional electronic devices. Pre-provided electronic circuits on a substrate are electrically connected by an ink solution that includes conductive particles (e.g., silver particles). The conductive particles are used to form conductors that interconnect conventional integrated circuits and to print electronic devices with electronic functions on a conventional circuit board.

Integrated circuits are relatively expensive and this limits their application, particularly at an item level (rather than a box or pallet of products containing many items). Furthermore, equipment for programming the RFID tags is generally short-range, so a reader needs to be purchased and installed at any location where RFID communications may be required. It is also problematic to associate RFID tags with specific containers, for example by affixing the tag to the container, without error or confusion. Moreover, affixed tags can be removed and lose their effectiveness at reducing error or theft.

There is a need, therefore, for an information-storing device that provides reduced process costs and parts costs, improved security and reliability, and a simplified process flow.

SUMMARY OF THE INVENTION

According to an aspect of the present invention, there is provided a method of making an electronic storage system, the method comprising:

receiving a substrate; a transceiver including a transceiver substrate separate from the substrate, an output electrical-connection pad, and a plurality of input electrical-connection pads; and a circuit template including a plurality of conductors;

a transceiver-disposing step of disposing the transceiver over the substrate;

a template-disposing step of disposing the circuit template over the substrate so that at least one of the plurality of conductors of the circuit template is electrically connected to the output electrical-connection pad and at least one of the plurality of conductors of the circuit template is electrically connected to each of the plurality of input electrical-connection pads; and printing at least one electrically-conductive strap so that each strap electrically connects the output electrical-connection pad to the at least one of the plurality of input electrical-connection pads through at least two of the plurality of conductors of the circuit template.

An advantage of the present invention is that it provides a unique identifier, e.g., for a product or container, without requiring a corresponding unique transceiver integrated circuit. Unique identification information can be provided on a much larger substrate than a conventional crystalline semiconductor substrate, and thus be provided using lower-cost equipment. In various embodiments, unique identification codes can be applied to storage systems at the point of use. Transceivers having smaller transceiver substrates can be used, reducing cost and space requirements. Various embodiments provide improved security and reliability by changing electrical characteristics if a transceiver is removed from a substrate. Various embodiments provide a simplified process flow compared to conventional systems using laser-trimmed RFID ICs. Various embodiments encapsulate a transceiver to provide robust operation in hostile environments.

BRIEF DESCRIPTION OF THE DRAWINGS

The above and other objects, features, and advantages of the present invention will become more apparent when taken in conjunction with the following description and drawings wherein identical reference numerals have been used, where possible, to designate identical features that are common to the figures, and wherein.

DETAILED DESCRIPTION OF THE INVENTION

In the following description, some embodiments will be described in terms that would ordinarily be implemented as software programs. Those skilled in the art will readily recognize that the equivalent of such software can also be constructed in hardware. Because communications algorithms and systems are well known, the present description will be directed in particular to algorithms and systems forming part of, or cooperating more directly with, systems and methods described herein. Other aspects of such algorithms and systems, and hardware or software for producing and otherwise processing the data involved therewith, not specifically shown or described herein, are selected from such systems, algorithms, components, and elements known in the art. Given the systems and methods as described herein, software not specifically shown, suggested, or described herein that is useful for implementation of any embodiment is conventional and within the ordinary skill in such arts.

Figure 1A:
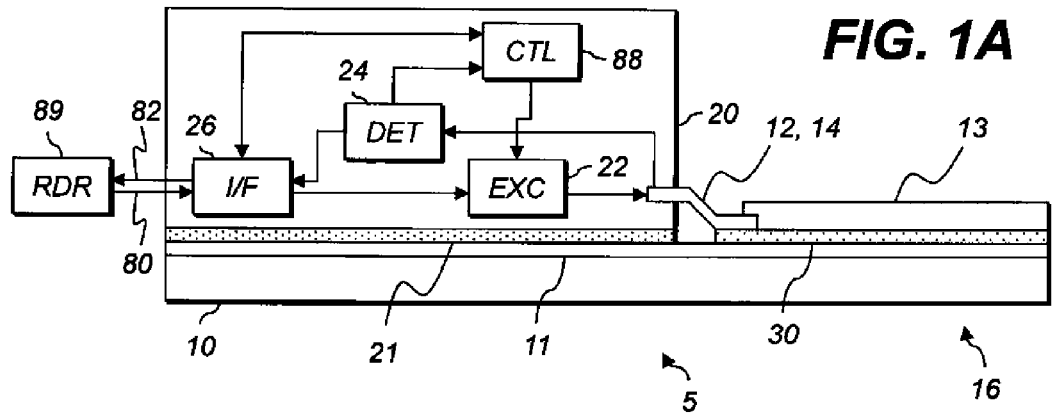
FIG. 1A is a side view of a schematic of an electronic storage system according to various embodiments.
Figure 1B:
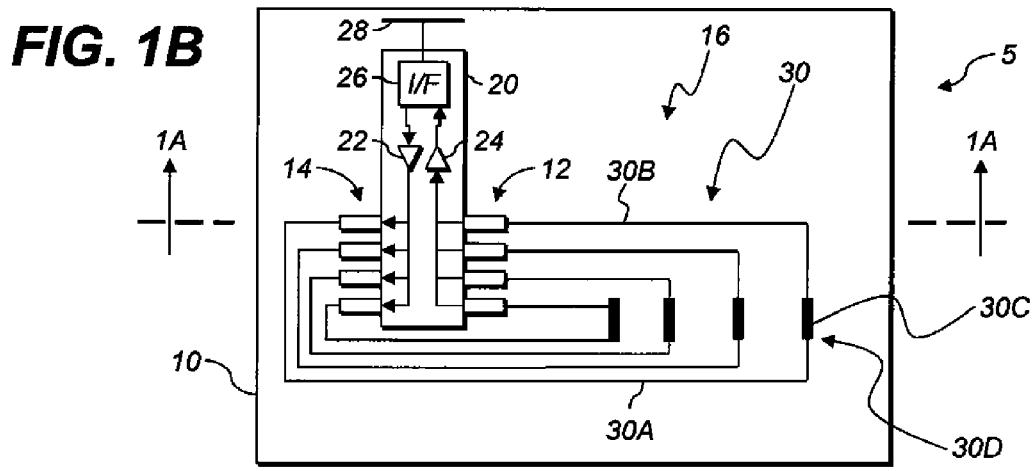
FIG. 1B is a plan view of a schematic of the electronic storage system of FIG. 1A.

FIG. 1A is a side view, and FIG. 1B, a plan, of a schematic according to various embodiments. FIG. 1A is shown along the line 1A-1A in FIG. 1B, except for the components of transceiver 20. These components are shown schematically.

Electronic storage system 5 includes substrate 10. A transceiver 20 is disposed over, and can be separate from, the substrate 10. Transceiver 20 includes interface 26 adapted to receive downlink signal 80. Transceiver 20 also includes output electrical-connection pad 14 and input electrical-connection pad 12. Transceiver 20 can include a plurality of output pads 14 or input pads 12. Excitation circuit 22 provides an excitation signal to output pad 14. Excitation signals are discussed below with reference to FIG. 7. Detection circuit 24 connects to input pad 12. Code circuit 16 separate from transceiver 20 is disposed over substrate 10 and includes conductor 30 disposed at least partly over substrate 10. The term "pad" refers to a conductor that is designed to interface with a device other than transceiver 20 and that has a designated function in that interface. Pads are not designed to directly connect circuit elements within transceiver 20 unless other conductive material is added outside transceiver 20 (e.g., conductor 30). No particular form of pad (leg, lead, ball, bump, or other) is required.

Transceiver 20 can be formed on a transceiver substrate 21, which can be separate from substrate 10 and disposed over substrate 10. Code circuit 16 is formed separately from transceiver 20 and is not integral therewith. Code circuit 16 can be formed on a substrate 10 different from the transceiver substrate 21. The transceiver 20 can include active and passive components, such as conductors, resistors, capacitors, and transistors. In various embodiments, the resistivity or sheet resistance of conductors in transceiver 20 is different from the corresponding property in conductors 30 of code circuit 16. The resistive differences can be of at least one decade. In other embodiments, conductors in transceiver 20 have smaller minimum dimensions than conductors 30 in code circuit 16 by at least one decade. In various embodiments, code circuit 16 does not include an electronic device on a substrate separate from substrate 10. In various embodiments, code circuit 16 occupies at least twice the area of substrate 10 as transceiver 20.

In various embodiments, transceiver 20 includes a plurality of input electrical-connection pads 12 and respective detection circuits 24. The input electrical-connection pads 12 and respective detection circuits 24 can be part of a larger circuit. Each conductor 30 in code circuit 16 is connected to a respective, different one of the input pads 12.

Code circuit 16 is adapted to electrically connect output pad 14 to input pad 12 so that detection circuit 24 detects an electrical state of input pad 12 in response to the excitation signal from excitation circuit 22. The electrical state is discussed below. The transceiver 20 further includes interface 26. Spontaneously, or in response to downlink signal 80 received from reader 89, interface 26 transmits uplink signal 82 representing the electrical state of input pad 12 to reader 89. The term "reader" here refers to any electronic device capable of causing transceiver 20 to respond with the information from code circuit 16, e.g., an RFID reader.

In various embodiments, detection circuit 24 includes circuitry that responds to signals on input pads 12, analyzes the signals to produce information, and temporarily stores the information (e.g., in SRAM). The information is then accessible for transmission by interface 26. Interface 26 reads the temporarily stored information and transmits it as an uplink signal 82 (FIG. 1A) through antenna 28. Antenna 28 can be disposed over or attached to substrate 10. Antenna 28 can be substantially coplanar with substrate 10 or protruding therefrom. The information can also be transmitted concurrently with its production by detection circuit 24, so that no temporary storage is required.

The electronic storage system 5 stores information that can be read using electronic circuits, for example by sensing voltage levels or currents, either at a specified time or over a period of time. Thus, the information can be static or dynamic. In one embodiment, electronic storage system 5 does not electronically write information into code circuit 16 but rather responds to information in code circuit 16 present as a result of the formation and mechanical configuration of code circuit 16.

Substrate 10 can be a commercially available substrate, e.g., glass, plastic, or metal. Substrate 10 can be a packaging material, including but not limited to paper, cardboard, wood, plywood, laminates, fiberboard, plastic, or a packaging material coated in polymer. Substrate 10 can be a disposable material and can have formed thereon a planarization layer 11 to facilitate the construction and performance of the code circuit 16. Layer 11 can also seal or smooth substrate 10. A seal 13 (e.g., a spin-coated layer) can be provided over code circuit 16 to protect code circuit 16. Commercial methods are known for manufacturing, cutting, shaping, and folding substrate materials, for example for packaging containers.

Transceiver 20 can be an integrated circuit, for example formed on a semiconductor transceiver substrate 21 such as silicon or gallium arsenide and can be crystalline, polycrystalline, or amorphous. Transceiver substrate 21 can be a circuit substrate that includes one or more circuits formed on or in the circuit substrate. Alternatively, transceiver substrate 21 can be formed on a non-semiconductor substrate with a semiconductor coating such as crystalline, polycrystalline, or amorphous semiconductor materials, for example silicon, or include oxide materials such as aluminum oxide, aluminum zinc oxide, or other oxide materials known in the art in which thin-film circuits can be formed, such as thin-film transistors. Transceiver substrate 21 can be adhered with an adhesive to substrate 10 either as part of planarization layer 11 or as a separate layer (not shown). Transceivers can communicate using standard protocols, such as EPCglobal Class-1 Gen-2 RFID, BLUETOOTH, WIFI, Ethernet, Aloha, or GSM, or custom protocols. The term "transceiver" as used herein includes transponders that respond to queries.

Transceiver 20 can include active electrical components, for example transistors or thin-film transistors formed on transceiver substrate 21. The active electrical components can form circuits in transceiver 20.

Transceiver 20 circuits include excitation circuit 22 for providing electrical signals that are electrically connected to output pads 14. The electrical signals from excitation circuit 22 provide electrical stimulation to code circuit 16 to produce an electrical response that is electrically detected through electrically connected input pads 12 by detection circuit 24. The excitation signal can be produced in response to a downlink signal 80 (e.g. an electromagnetic signal). The excitation signal can also be produced upon command of controller 88 in transceiver 20. Controller 88 can include a CPU, MPU, FPGA, PLD, PLA, PAL, ASIC, or other logic or processing device. The excitation signal can be produced at regular time intervals, time intervals based on past electrical-state readings, or in response to a reading from a sensor (not shown) connected to controller 88. The excitation signal can also be produced in response to external events, such as human actuation of a user control or the receipt of an external signal (e.g., SYNC). Controller 88 can also be connected to detection circuit 24 and interface 26.

The detected electrical state is communicated, encoded in an uplink signal 82, through interface 26. Interface 26 includes communication circuits for receiving downlink signal 80 and transmitting uplink signal 82 and is connected to excitation and detection circuits 22, 24.

Transceiver 20 can be a radio-frequency identification (RFID) transceiver that, in response to downlink signal 80 requesting information, communicates information stored in code circuit 16 through uplink signal 82. The RFID transceiver can include an antenna 28 disposed over or formed on substrate 10. Antenna 28 is connected to transceiver 20, electrically or otherwise, to receive downlink signal 80 and, in response to transceiver 20, transmit uplink signal 82. Transceiver 20 can be formed in an integrated circuit having a separate transceiver substrate 21 and applied to substrate 10. For example, the transceiver can be formed on a silicon wafer, packaged in a ball-grid array (BGA) package, and placed on a printed-circuit board substrate 10 using an automated pick-and-place machine. The transceiver IC can also be supplied as a bare die, e.g., a known-good die (KGD), and bonded directly to the substrate. Alternatively, transceiver 20 can be formed on or over substrate 10 by printing semiconductor materials and conductors using various methods known in the art, for example inkjet deposition methods.

Figure 2:
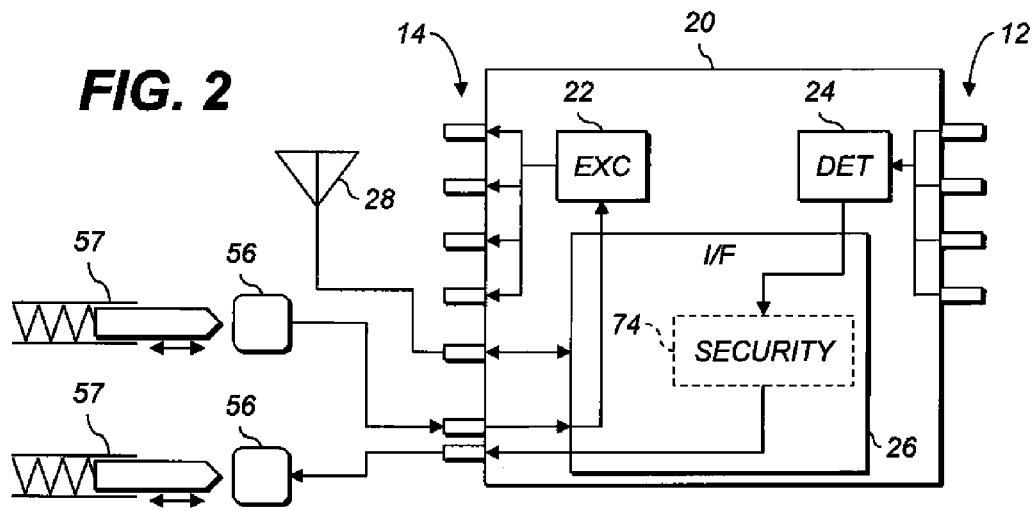
FIG. 2 is a schematic of an integrated circuit according to various embodiments.

FIG. 2 shows transceiver 20 packaged in an integrated circuit with input and output electrical interconnection pads 12, 14. Transceiver 20 can be applied to the substrate 10 in a variety of ways known in the art, for example with pick-and-place or surface mount technologies. Input pads 12, output pads 14, detection circuit 24, and excitation circuit 22 are as shown in FIGS. 1A and 1B.

In various embodiments, input pads 12 or output pads 14 are provided as pins, bumps, pads, leads, or other contact types found in integrated circuits of various formats, for example pin-grid arrays, ball-grid arrays, small-outline packages, or thin small-outline packages. Input or output pads 12, 14 provide an externally accessible electrical connection to the circuits in transceiver 20. Excitation circuit 22 is connected to output pads 14, and detection circuit 24 is connected to input pads 12. In various embodiments, a single pad serves as an output pad 14 and an input pad 12, either simultaneously or sequentially, as is discussed below.

In various embodiments, transceiver 20 includes, or is electrically connected to, one or more electrical connectors 56. Interface 26 communicates with electrical connectors 56. Connectors 56 can be, e.g. pads, sockets, pogo pins, bond wires, or pins, adapted to mechanically contact one or more electrodes 57 separate from the transceiver to form one or more electrical connections between electrical connectors 56 and electrodes 57. In the example shown, electrodes 57 are pogo pins and the electrical connectors are pads. Transceiver 20 can be interrogated through wired readers, probe cards, communications controllers, or other interrogation devices.

In various embodiments, transceiver 20 is connected to RF antenna 28, to one plate of a capacitor, or to an inductor. This permits wireless data transfer. In various embodiments, information stored in the code circuit is transferred to reader 89 (FIG. 1A), by wired or wireless connection. In various embodiments, interface 26 includes optional security circuit 74 that controls access to information read from code circuit 16. Security circuit 74 includes storage for an enablement signal. If the stored enablement signal is present or has the correct value, interface 26 is permitted to transmit information received from detection circuit 24. If the enablement signal is not present or is incorrect, interface 26 is not permitted to transmit information from detection circuit 24. The enablement signal can be provided electronically or by using software. In an example, a password is supplied to security circuit 74 through a computer-mediated graphical user interface or a physical switch. Security circuit 74 compares the received password to a stored secret and sets the enablement signal if the password and the secret match. In other embodiments, security circuit 74 calculates a cryptographic hash of a known secret plus salt, a challenge or nonce from reader 89 (FIG. 1A), or both. Security circuit 74 compares the calculated hash with a hash received from reader 89, and enables if the hashes match. Security circuit 74 can include logic or software to perform public- or private-key encryption, block or stream ciphering, key exchange, hashing, compression or decompression, or any combination of those.

Referring back to FIGS. 1A and 1B, code circuit 16 can be formed directly on the substrate 10 or on layers (e.g. planarization layer 11) formed on the substrate 10. Layer 11 can be a spin-coated planarization layer or a conformal coating. The code circuit 16 can include active or passive elements such as resistors, conductors, capacitors, inductors, and transistors, for example thin-film transistors.

The conductors 30 can be formed in a variety of ways. In various embodiments, conductive inks are pattern-wise applied to the substrate 10 and connected to the input and output pads 12, 14, for example with an inkjet device or with various printing devices such as flexographic, gravure and other known printing methods to form the conductors 30. A conductor 30 can include conductive particles and non-conductive binder particles. Non-conductive particles can be removed using chemical methods or exposure to radiation (e.g., ultraviolet light). The patterned conductive inks are cured to form the code circuit 16. The conductors 30 form conductive wires, resistors, capacitors, inductors and other passive electrical devices in such a way that information is stored in the circuit to be retrieved when code circuit 16 is queried with an excitation signal, as is described further below.

Figure 3:
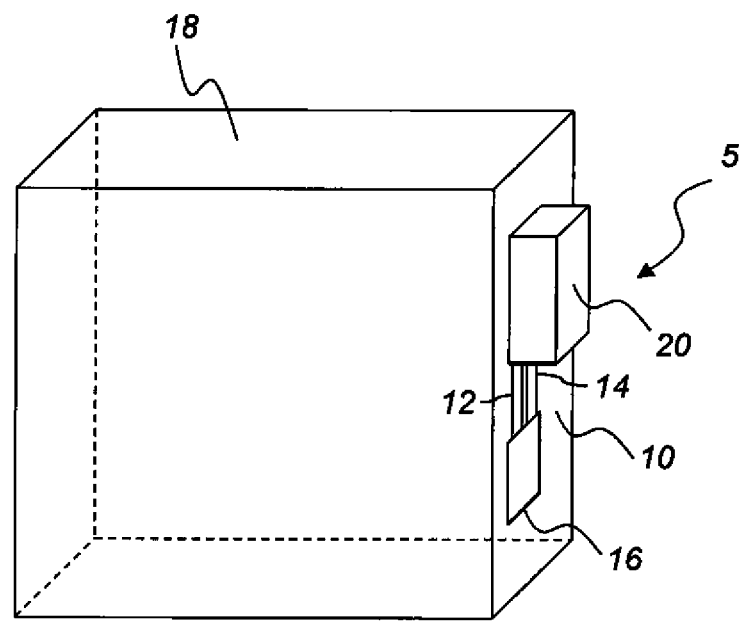
FIG. 3 is a perspective of an electronic storage system mounted on a container according to various embodiments.
Figure 4:
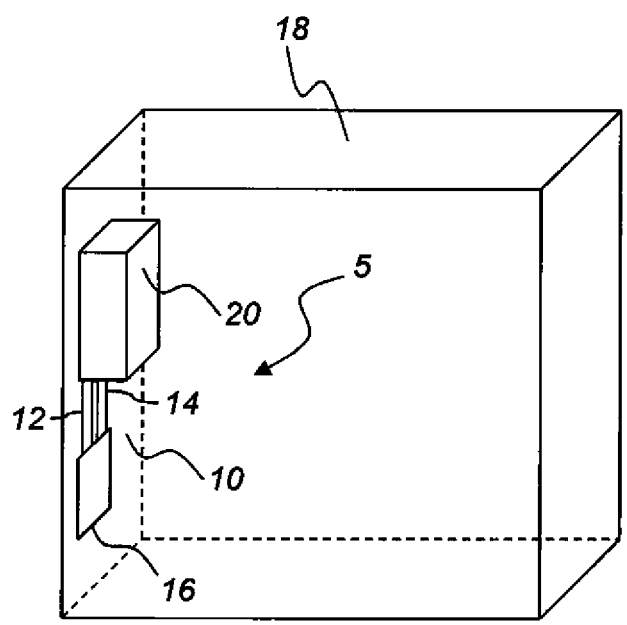
FIG. 4 is a perspective of an electronic storage system mounted on a container according to various embodiments.

FIGS. 3 and 4 show electronic storage system 5 mounted on or part of container 18. Container 18 can be, for example, packaging for a product. Substrate 10 can be a portion of container 18, for example, a side of a cube or other container with rectangular sides. Container 18 can be a cardboard box with or without various layers (examples below) or insignia. In this embodiment, transceiver 20 is affixed to substrate 10 and electrically connected through input and output pads 12, 14 to code circuit 16. Code circuit 16 is formed on substrate 10, e.g., the side of container 18, or on layers formed on substrate 10 (e.g. finishing layers, water resistant layers, and ink layers). In various embodiments, the transceiver 20 and code circuit 16 are disposed over the exterior of container 18 (FIG. 3) or the interior of container 18 (FIG. 4). Transceiver 20 and code circuit 16 can be located on different sides of container 18. Transceiver 20 can be disposed over the outside of container 18, and code circuit 16 disposed over the inside of container 18, or vice versa.

Figure 5:
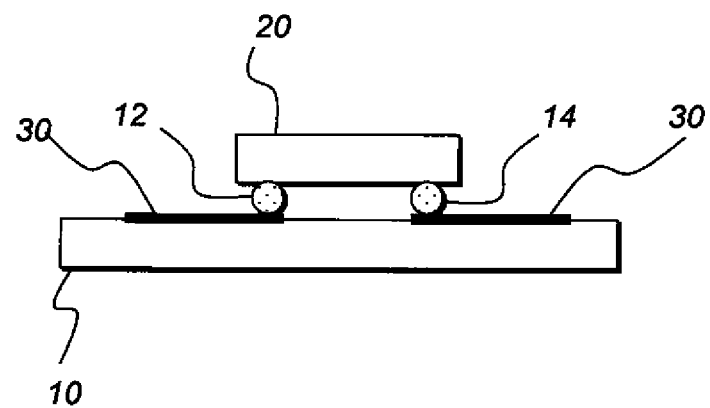
FIG. 5 is a schematic of a transceiver mounted on a substrate according to various embodiments.

FIG. 5 shows various embodiments in which input pads 12 and output pads 14 are arranged on the side of transceiver 20 facing substrate 10, and conductors 30 are disposed at least partially between substrate 10 and transceiver 20.

Figure 6:
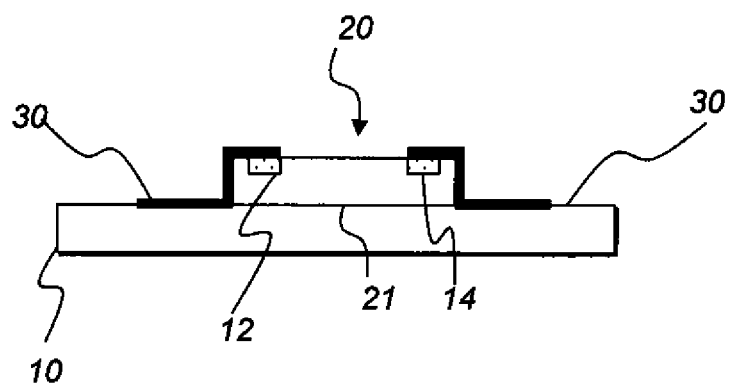
FIG. 6 is a schematic of a transceiver mounted on a substrate according to various embodiments.

FIG. 6 shows various embodiments in which transceiver 20 is disposed on a transceiver substrate 21 separate from substrate 10. Input pads 12 and output pads 14 are arranged on the side of transceiver 20 opposite substrate 10. Conductors 30 are disposed at least partially over the transceiver substrate 21. In various embodiments, transceiver 20 includes one or more electrical connectors that mechanically contact one or more electrodes to form one or more electrical connections between the electrical connectors and the electrodes (not shown). As discussed herein, the electrodes can be pogo pins.

Figure 7:
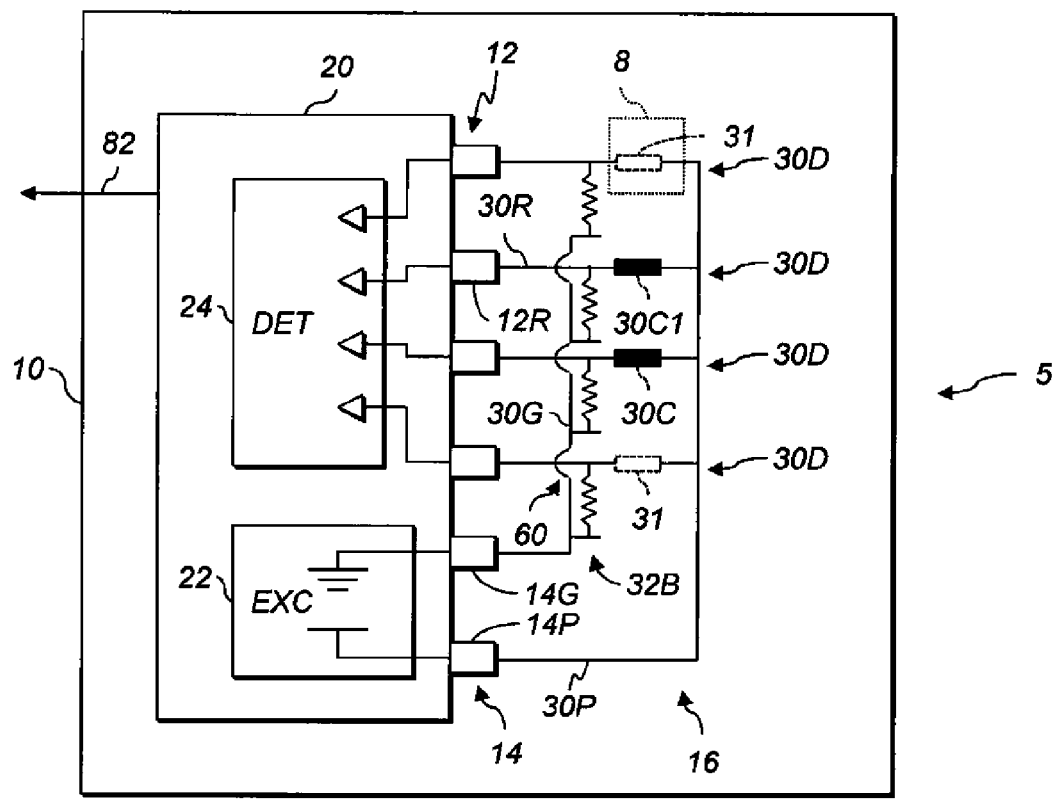
FIG. 7 is a schematic of an electronic storage system according to various embodiments.

FIG. 7 shows electronic storage system 5 including substrate 10. Transceiver 20 is disposed over substrate 10 and is electrically connected to code circuit 16 disposed over substrate 10. Code circuit 16 includes conductors 30P and 30R, and electrically-conductive strap 30C. Transceiver 20 includes at least one input pad 12 connected to a conductor (e.g., conductor 30R) and at least one output pad 14 connected to a conductor (e.g., conductors 30G, 30P).

In various embodiments, code circuit 16 includes multiple conductors or conductive wire elements. In this example, conductor 30P is electrically connected to the at least one of the output pads 14P, and second conductor 30R is electrically connected to the at least one of the input pads 12R. Conductors 30P, 30R are spaced apart from each other to form separate conductive wire elements. Electrically conductive strap 30C1 creates a low-resistance electrical connection between conductor 30P and second conductor 30R, and is in mechanical and electrical contact with both conductors 30P and 30R. In this way, strap 30C1 electrically connects input pad 12R to output pad 14P. Straps can include bus ties, wires, jumpers (hardwired or removable, e.g., on 0.100" or 2.5 mm centers), or other low-resistance (e.g., <10Ω, <1Ω, or <0.1Ω) conductors.

Figure 8:
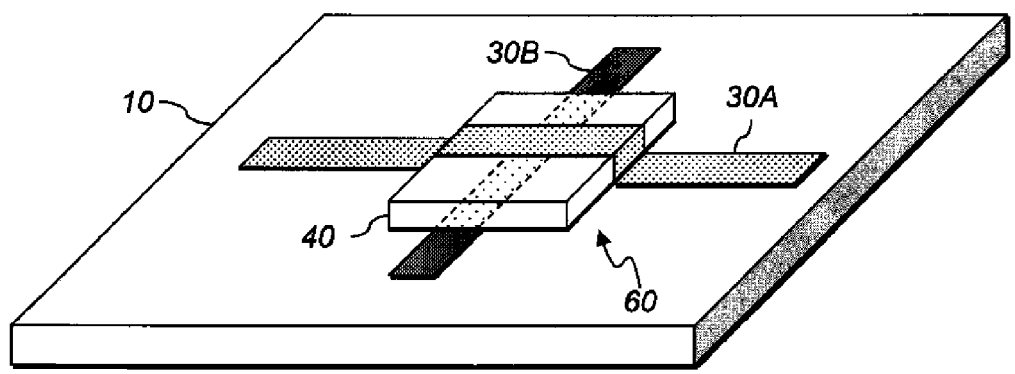
FIG. 8 is a perspective of overlapping patterned conductors according to various embodiments.

FIG. 8 shows substrate 10, disposed over which are conductors 30A and 30B. Insulating layer 40 separates conductor 30A from conductor 30B at overlapping conductor intersection 60, where the paths of conductors 30A, 30B cross. Conductor 30A passes over conductor 30B, with insulating layer 40 between them. This permits forming more complex conductor paths in code circuit 16, such as those shown in FIG. 7, e.g., where conductor 30G crosses conductor 30R. The insulating layer 40 can be localized in extent and need not extend over the whole surface of substrate 10, but can do so. The insulating layer 40 can be formed by printing or inkjet depositing an insulating material that is cured, for example a resin.

Referring back to FIG. 7, code circuit 16 defines a plurality of sites 30D. At each site 30D, a conductive strap 30C, a resistor, or another passive element can be placed or deposited to connect the corresponding conductors. The site can also be left open, referred to herein as an open site 31. The term "open site" is used rather than "missing strap" because resistors or other passive elements can also be placed at site 30D. In the example shown, conductor 30P is connected to output pad 14P, which is supplying voltage or power. Conductor 30G is connected to output pad 14G, which is grounded. Each conductor 30R connected to an input pad 12 is pulled to ground through a corresponding resistor 32B, conductor 30G, and output pad 14G. The pulldown resistors can be, e.g., 10 kΩ or higher. At sites 30D with open sites 31, the corresponding input pad will have a low voltage on it, approximately equal to the voltage from output pad 14G (0VDC). At sites 30D with conductive straps 30C, the corresponding conductor 30R and input pad 12 will have a voltage approximately equal to the voltage from output pad 14P. The voltage on each input pad 12 can be compared to a threshold value, e.g., using a TTL input buffer, to determine that the digital value for input pads 12 with open sites 31 at the corresponding sites 30D is 0, and the digital value for input pads 12 with conductive straps 30C is 1.

In various embodiments, pull-down resistors 3213 are connected to input pads 12 within the transceiver 20. These embodiments do not require output pad 14G or corresponding conductor 30G. Resistors 3213 can be formed from resistive wires, for example made of conductors having less conductive material or made of material that is less conductive.

In this example, the excitation signal applied by excitation circuit 22 is a static signal including a V+ signal from output pad 14P and a ground signal from output pad 14G. Detection circuit 24 can compare the electrical signal on any input pad 12 to a reference voltage to discriminate the input signal from the V+ and ground signals to determine the value of the input signal and thus the digital information stored in the code circuit 16.

Excitation circuit 22 produces an excitation signal on output pads 14. The excitation signal is an electrical query signal. The excitation signal can be static, e.g., a fixed voltage, such as a bus connection, or a fixed current. Alternatively, the query signal can have a first voltage or current at a first point in time and a second, different voltage or current at a second, later point in time. In this embodiment, the excitation signal is dynamic and the detection circuit is adapted to measure a voltage or current of at least one of the input pads 12 electrically connected through the code circuit 16 to the at least one of the output pads 14 to provide the respective electrical state(s) of the at least one of the input pads 12 and thus determine the information in the code circuit 16. The electrical state(s) can be analog or digital. Components of code circuit 16 can include conductors, resistors, capacitors, inductors, and batteries (chemical charge storage).

In various embodiments, code circuit 16 stores one digital bit (either logical 1 or logical 0) of information per input pad 12. In various embodiments, the respective electrical state(s) of the input pads 12 correspond to a plurality of bits of information in the uplink signal 82. For example, the information stored in the code circuit 16 and communicated through the uplink signal 82 can include 96 bits of information.

For example, as described in the GS1 EPC Tag Data Standard ver. 1.6, ratified Sep. 9, 2011, incorporated herein by reference, an RFID tag can carry a "Serialized Global Trade Item Number" (SGTIN). Each SGTIN uniquely identifies a particular instance of a trade item, such as a specific manufactured item. For example, a manufacturer of cast-iron skillets can have, as a "product" (in GS1 terms) a 10" skillet. Each 10" skillet manufactured has the same UPC code, called a "Global Trade Item Number" (GTIN). Each 10" skillet the manufacturer produces is an "instance" of the product, in GS1 terms, and has a unique Serialized GTIN (SGTIN). The SGTIN identifies the company that makes the product and the product itself (together, the GTIN), and the serial number of the instance. Each box in which a 10" skillet is packed can have affixed thereto an RFID tag bearing the SGTIN of the particular skillet packed in that box. SGTINs and related identifiers, carried on RFID tags, can permit verifying that the correct products are used at various points in a process. Code circuit 16 can encode the 96-bit SGTIN for the instance in a particular container 18 (FIG. 3).

Code circuit 16 can also store other unique IDs or similar values, e.g., 32-bit IPv4 addresses, 48-bit Ethernet MAC addresses, 128-bit IPv6 addresses, a 128-bit GUID or UUID, or other physical-, data-link-, or network-level device addresses.

In various embodiments, detection circuit 24 in transceiver 20 includes reading circuitry having a plurality of different voltage thresholds so that the voltage of at least one of input pads 12 corresponds to more than one bit of information. In various embodiments, detection circuit 24 can include an A/D converter to measure the voltage of at least one of input pads 12, either dynamically or statically. A comparator can be also used to discriminate various voltage levels by comparison to references produced by, or supplied to, transceiver 20. The present disclosure is not limited to storing particular types or values of information.

Figure 9:
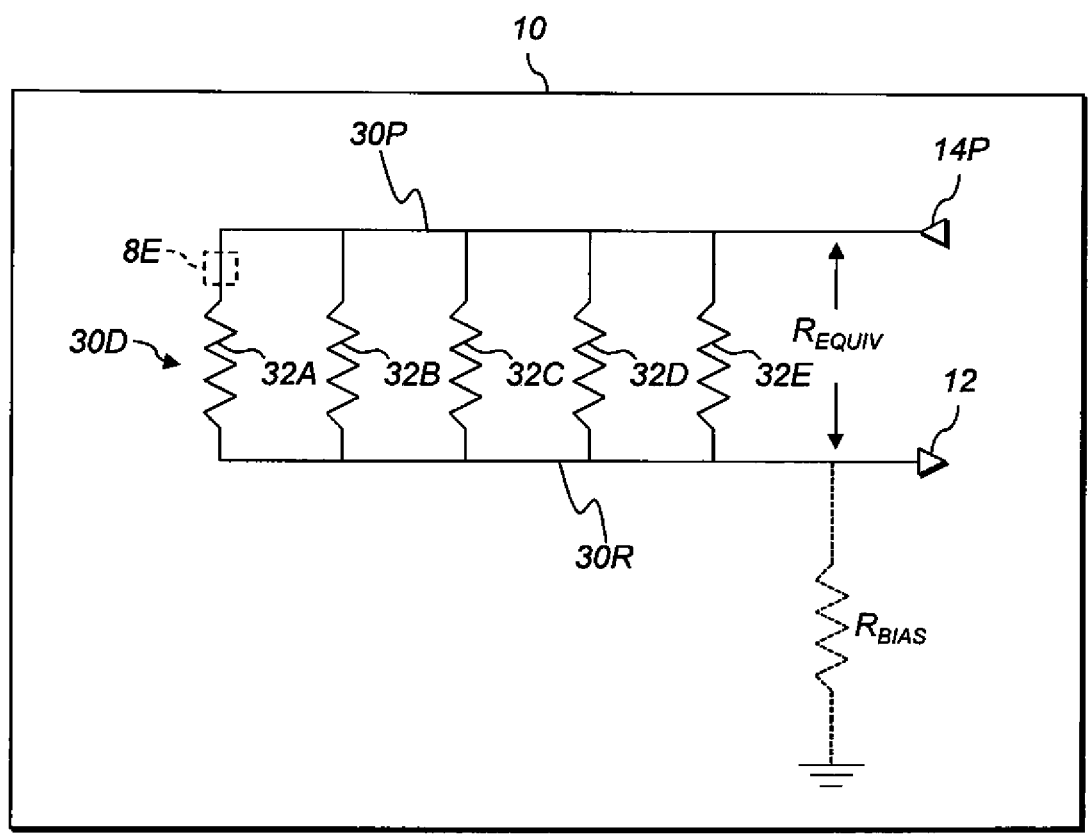
FIG. 9 is a circuit diagram of a resistor ladder circuit according to various embodiments.

Referring to FIG. 9, in various embodiments, code circuit 16 includes a resistor ladder to provide a variety of voltage levels. FIG. 9 shows an array of resistors 32A, 32B, 32C, 32D, 32E connected in parallel. The array is formed on substrate 10 and connected to output pad 14P through conductor 30P. The array is connected to input pad 12 through conductor 30R. Each resistor 32A, 32B, 32C, 32D, 32E can correspond to a site 30D. The parallel equivalent resistance of resistors 32A, 32B, 32C, 32D, 32E is $R_{equiv}$.

In various embodiments, the electrical state is a voltage related to $R_{EQUIV}$. A reference voltage $V_{14}$ is applied to conductor 30P from output pad 14P. A constant current $I_{12}$ is drawn from output pad 14P by a constant-current sink in detection circuit 24 (FIG. 1A). This develops a voltage $V_{12}$:

$$V_{12} = V_{14} - I_{test} \times R_{equiv}$$

$V_{12}$ is sensed at input pad 12 through conductor 30R.

In other embodiments, resistor $R_{bias}$ is connected between conductor 30R and ground (or another fixed reference voltage). Voltage $V_{14}$ is applied on output pad 14P. The resulting voltage $V_{12}$ is $$V_{12} = (V_{14} - 0) \times R_{bias} / (R_{equiv} + R_{bias}),$$

which is measured on input pad 12.

In the current-sink and $R_{bias}$ embodiments, $V_{12}$ depends upon the number of resistors 32A, 32B, 32C, 32D, 32E connected to the ladder circuit. Thus, different sensed voltage levels can correspond to different digital values; for example five resistors can provide five different voltage values. If the resistors are different, for example having resistive values in a logarithmic sequence, such as a base-2 sequence, five resistors can provide 32 different resistive values that can be sensed and discriminated to provide a 32-bit digital value. If the resistors have the same resistance, the different digital values can be encoded by removing (or adding) any resistor at any site 30D. If the resistors have different resistances, the different resistive values are provided by applying only those resistors corresponding to the desired digital value. The overall resistance can be changed over time by removing or adding resistors at sites 30D. This will be discussed further below.

Figure 10:
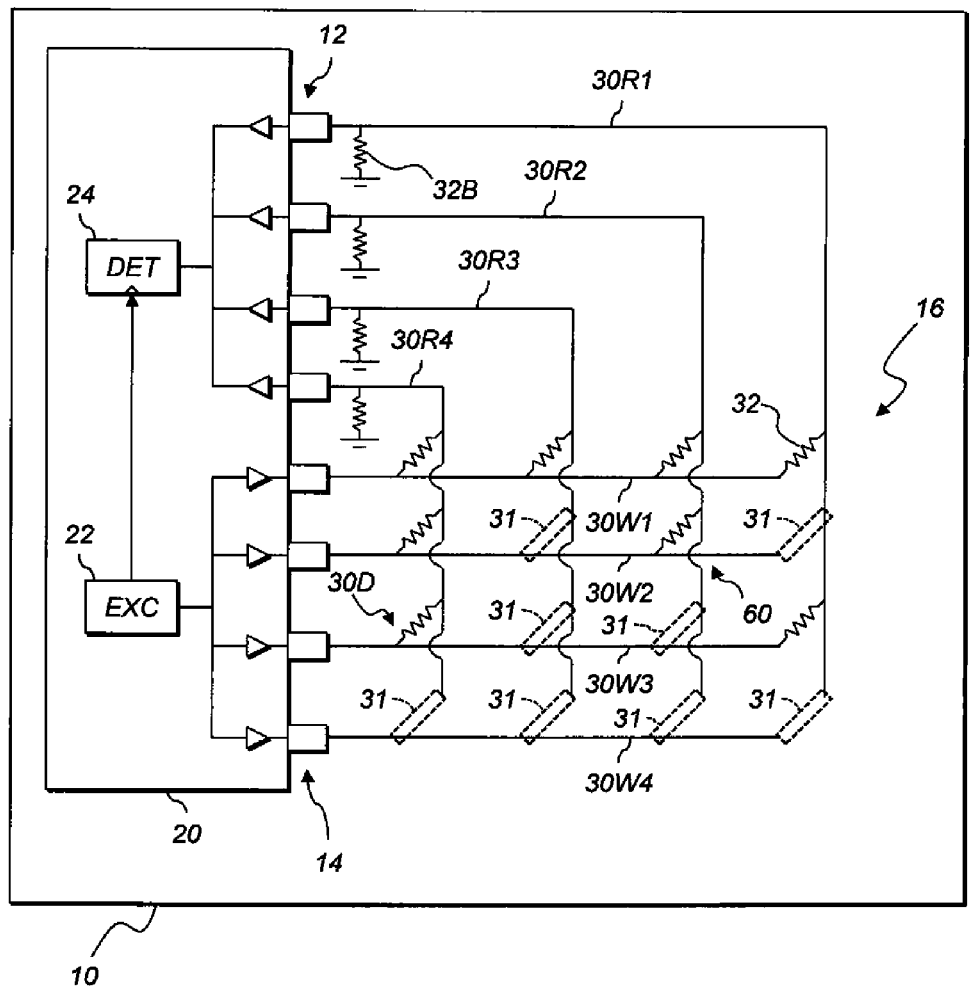
FIG. 10 is a schematic of an electronic storage system according to various embodiments.

FIG. 10 shows various embodiments in which the detected signal contains different information depending on the excitation signal, and the excitation signal varies over time. This example is a matrix-addressing design. Other addressing or timing designs can also be used. Sites 30D are arranged in a two-dimensional array. Each site 30D has a corresponding resistor 32 (or conductive strap 30C, FIG. 7) or open site 31 (which is indicated by a dashed outline). One side of each resistor 32 or open site 31 is connected to one of the output pad(s) 14 through one of the conductor(s) 30W1, 30W2, 30W3, 30W4. The other side of resistor 32 or open site 31 is connected to one of the input pad(s) 12 through one of the conductor(s) 30R1, 30R2, 30R3, 30R4. Pads 12, 14 are connected to transceiver 20. The array of sites 30D, the resistors 32 and open sites 31, and conductors 30W1, 30W2, 30W3, 30W4, 30R1, 30R2, 30R3, and 30R4 compose code circuit 16. In various embodiments, the presence or absence of resistors 32 encodes digital information in code circuit 16. A site 30D with a resistor 32 can correspond to a 1 value, and a site 30D without a resistor (with an open site 31) can correspond to a 0 value.

To read the encoded information, excitation circuit 22 provides a voltage signal (e.g. V+) on one of the output pads 14 and a ground signal on the remainder of the output pads 14. Excitation circuit 22 can also cause the remainder of the output pads 14 to operate in high-impedance (high-Z) mode. Pull-down resistors 32B pull the voltages on conductors 30R1, 30R2, 30R3, 30R4 to ground or another voltage. Pull-down resistors 32B can be disposed over substrate 10, part of code circuit 16, or built in to transceiver 20. Pull-down resistors 32B can be connected to a voltage supply or rail, a supply or ground plane, or an output pad 14 (e.g., as shown in FIG. 7, output pad 14G). As a result, voltages are developed on conductors 30R1, 30R2, 30R3, or 30R4. Those connected by resistors 32 to the conductor (of conductors 30W1, 30W2, 30W3, or 30W4) on which the output pad 14 is providing the voltage signal develop a voltage close to V+(through the resistor divider); those not connected are pulled down. Detection circuit 24 receives, through input pads 12, the voltage signal for each conductor 30R1, 30R2, 30R3, 30R4.

Excitation circuit 22 then activates each output pad 14 successively, simultaneously deactivating (0 or high-Z) the other output pads 14, and directs detection circuit 24 to capture the corresponding voltages on input pads 12. This process is repeated for each of the output pads 14 until detection circuit 24 has sensed a voltage signal from each site 30D, or a desired subset of the sites 30D. For example, when V+ is driven on conductor 30W1, conductors 30R1, 30R2, 30R3, 30R4 see approximately V+. When V+ is driven on conductor 30W3, only conductors 30R1 and 30R4 see V+, and conductors 30R2 and 30R3 are pulled down.

This arrangement advantageously reduces the number of input and output pads 12, 14 required to access a selected number of bits from code circuit 16. The number of sites 30D that can be accessed is the product of the number of input pads 12 and the number of output pads 14. In various embodiments, resistors 32 can have more than one value, and each site 30D encodes more than one bit (e.g., as described above with reference to FIG. 9, but with a single resistor of value $R_{equiv}$ rather than a ladder).

In various embodiments, the code circuit 16 can include capacitive or inductive elements, as well as resistive and conductive elements. As is known in the analog circuit arts, these circuits can have a dynamic response to a dynamic signal for example with resistor-capacitor or -inductive circuits. For example, the excitation signal can include a frequency sweep on one or more of the output pads. A frequency sweep is a signal whose frequency varies monotonically over time, for example from a low frequency to a high frequency. The gain of code circuit 16 at a particular frequency can store information. For example, one or more electronic band-gaps (EBGs) can be placed in series in code circuit 16. Each EBG has a particular notch frequency. Whether or not a notch is present at a selected test frequency encodes one bit of information. Series-EBG structures have been described in RFID tags. The dynamic response to one or more different dynamic signals can be used to encode analog information. The analog information can be digitized to provide digital information, or the analog information can be provided directly to a reader.

In an example, a single output pad 14 is used to pump code circuit 16 at a specified frequency, then that output pad 14 is used to listen for energy at that frequency to determine whether code circuit 16 resonates at that frequency. The presence or absence of resonance above a selected threshold provides one bit of information. In these embodiments, code circuit 16 can include an LC tank circuit. In another example, excitation circuit 22 provides a selected test current on a single input pad 12, and detection circuit 24 monitors the voltage on that input pad 12 while the current is applied. In these embodiments, code circuit 16 can include a resistor between the input pad 12 and a selected voltage rail.

Figure 11:
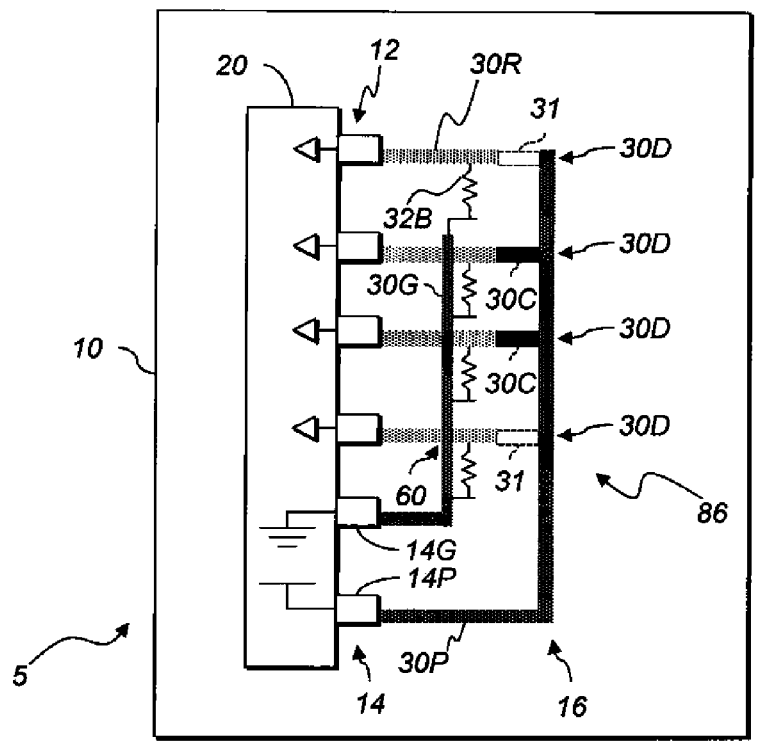
FIG. 11 is a schematic of a circuit template and related components according to various embodiments.
Figure 12:
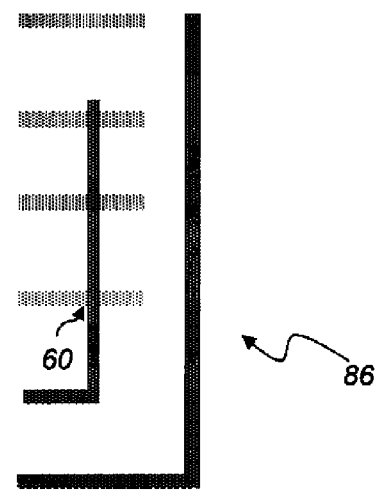
FIG. 12 is a schematic of a circuit template according to various embodiments.

Referring to FIGS. 11 and 12, in various embodiments, circuit template 86 is disposed over substrate 10 and electrically connected to input and output pads 12, 14. FIG. 12 shows circuit template 86 on its own; FIG. 11 shows circuit template 86, transceiver 20, and related components. For clarity, numbers are not shown for all corresponding components. Circuit template 86 includes patterned conductive material, for example a cut or stamped conductive copper, silver, or aluminum foil. The patterned conductive material forms a portion of code circuit 16. Circuit template 86 can be affixed to the substrate 10, e.g., with adhesive, or can be deposited on the substrate 10, e.g., by chemical vapor deposition (CVD) or physical vapor deposition (PVD). Conductors in circuit template 86 can have resistivities <5Ω/□, <1Ω/□, >100Ω/□, or other ranges.

Circuit template 86 is disposed over substrate 10 and includes one or more conductors 30P, 30R electrically at least partially connecting the at least one of the output pads 14G, 14P to the at least one of the input pads 12 through at least two of the conductors 30P, 30R of the circuit template 86. Circuit template 86 can be bonded with an adhesive to substrate 10 and can be formed by punching a foil sheet with a patterned stamp in a stamp press. Circuit template 86 electrically forms a portion of code circuit 16. In addition to foil conductors, circuit template 86 can include pull-down resistors 32B. Resistors 32B can be formed where desired by a programmable printer.

In this example, as in that of FIG. 7, code circuit 16 (here, circuit template 86) defines a plurality of sites 30D. Conductive material can be applied over affixed circuit template 86 (e.g., using inkjet deposition) at selected sites 30D to complete the code circuit 16. At each site 30D, a conductive strap 30C, a resistor, or another passive element can be placed or deposited to connect the corresponding conductors. The site can also be left open, referred to herein as an open site 31. In the example shown, straps 30C connect the corresponding input pads 12 to voltage (e.g., +5VDC) through conductor 30P and output pad 14P, which is supplying voltage or power. The resulting digital value can be a 1. Input pads 12 connected to open sites 31 are pulled to ground through a corresponding resistor 32B, conductor 30G, and output pad 14G, which is grounded. The pulldown resistors can be, e.g., 10 kΩ or higher. This can be a digital value of 0.

Some of the conductors (in dark hatching) can pass over or under other conductors (in light hatching) to form overlapping intersections 60. The template can include multiple layers of conductors, and non-conducting insulating or support layers to permit conductors to cross without electrically contacting. Circuit template 86 can also be a single layer. The pull-down or pull-up resistors 32B can be integrated into the transceiver 20 or circuit template 86.

In various embodiments, transceiver 20, circuit template 86, or both are printed. In an example, substrate 10 is the outside of container 18 (FIG. 3). An offset press is used to print any number of color channels of markings on substrate 10 (e.g., K or CMYK, or optional spot colors). Additional stations in the offset press are used to deposit layers of conductive ink, insulating ink, and semiconductive ink over substrate 10. Conductive ink layers and optional insulating ink layers can be used to form circuit template 86. Those layers together with semiconductive ink can be used to form transceiver 20. Conductive inks can include silver particles, as discussed herein, or can include conductive polymers such as PEDOT. Semiconductive inks can include, e.g., poly 3-hexylthiophene such as that sold by PLEXTRONICS under the trade name PLEXCORE OS. This material can be used to produce p-type organic semiconductors. Other conductive polymers can be used, with optional doping, e.g., pentacene, melanin, anthracene, poly(p-phenylene vinylene) (PPV), and polyacetylene.

Figure 13:
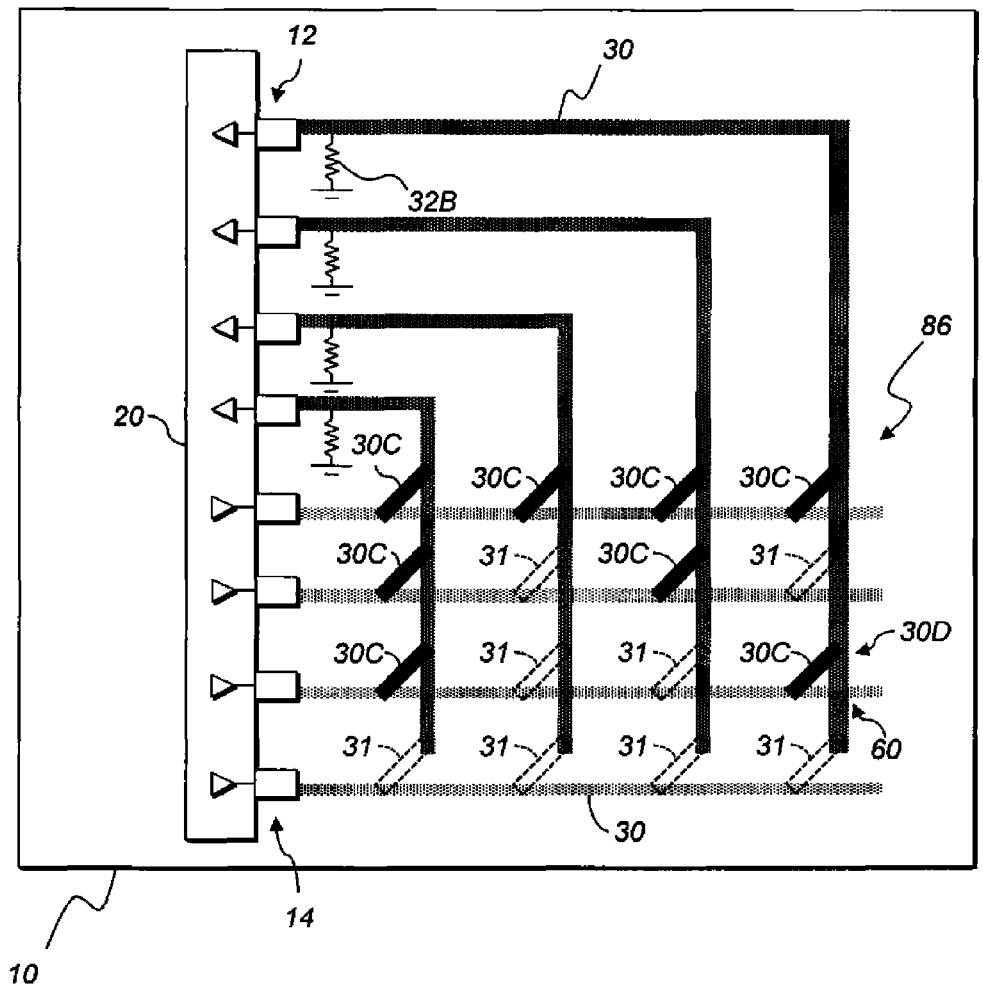
FIG. 13 is a schematic of a circuit template and related components according to various embodiments.
Figure 14:
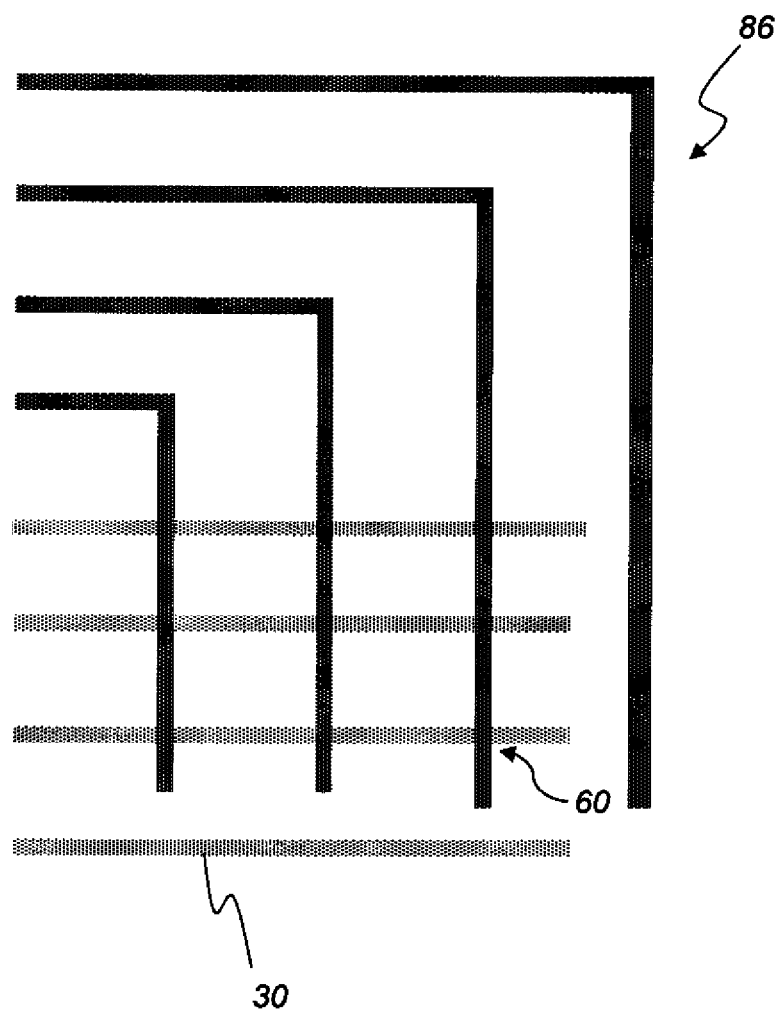
FIG. 14 is a schematic of a circuit template according to various embodiments.

FIGS. 13 and 14 show circuit template 86 having a matrix configuration. FIG. 14 shows circuit template 86 on its own; FIG. 13 shows circuit template 86, transceiver 20, and related components. In various embodiments, conductors 30 of circuit template 86 are divided into an input group and an output group. In this example, conductors 30 connected to output pads 14 are in the output group, and the conductors 30 connected to input pads 12 are in the input group. Each conductor in the input group is connected to one of the input pads 12 and each conductor in the output group is connected to one of the output pads 14. The conductors are spaced apart, and are arranged to define a plurality of sites 30D. In this example, the sites are proximate to intersections 60. At each site, a respective strap 30C or resistor 32 (not shown) can be disposed, or the site can be left open (open site 31). The sites can be points, lines, or areas, and can be sized to fit resistors 32 and straps 30C. Sites can also be sized and oriented to provide a desired ampacity on straps 30C. The sites 30D can be relatively large and visible to the human eye, or microscopic in size. Straps 30C and resistors 32 can be laterally contained within a site 30D, or extend beyond site 30D as long as they do not short to other conductors in an undesired way.

Each site is thus associated with at least one of the input conductors and at least one of the output conductors. Each strap 30C electrically connects the respective associated one of the input conductors to the respective associated one of the output conductors. At least one of the output conductors can be the associated one of the output conductors for a first one of the sites associated with a first one of the input conductors and a second, different one of the sites associated with a second, different one of the input conductors. In this example, which is a 4×4 matrix, each output conductor is associated with four sites 30D, one for each of the four input conductors.

In various embodiments, code circuit 16 is printed on or over substrate 10 using printing techniques including programmable inkjet deposition to provide a unique code circuit for each of a plurality of substrates 10, for example different containers or packages. For example, an inkjet printer can selectively print straps 30C (FIG. 7) to deposit a pattern corresponding to a unique binary code for each substrate 10.

As described above, in other embodiments, a circuit template 86 (FIG. 11) is affixed to each of a plurality of substrates 10. The circuit templates 86 affixed to each substrate 10 are substantially identical. The remaining portion of code circuit 16 is then formed with a programmable printing device, such as an inkjet system, by depositing conductive inks or other conductive materials, and optionally curing them, to form resistors or conductors, as described above. This process usefully improves throughput in a manufacturing process and can improve electrical performance and reduce manufacturing costs by reducing the need for additional integrated circuitry to hold unique-ID information, and by enabling encoding at the point of manufacturing or packaging.

Figure 15:
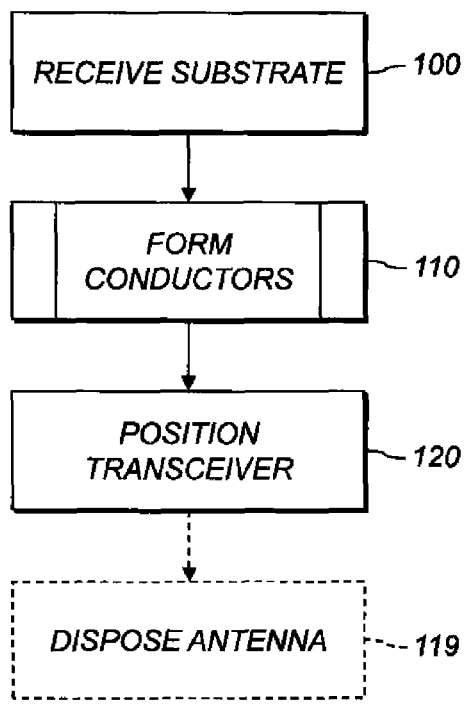
FIGS. 15-16 are flow diagrams illustrating details of methods according to various embodiments.

FIG. 15 shows methods of making an electronic storage system according to various embodiments. A substrate, e.g., substrate 10 (FIG. 1A), is received (or provided) in step 100. In step 110, one or more conductor(s) that form all or part of a code circuit (e.g., code circuit 16, FIG. 1A) or a circuit template (e.g., circuit template 86, FIG. 12) are disposed over, or formed on, the substrate. Various embodiments of step 110 are discussed below with reference to FIGS. 17-19. After step 110, a transceiver (e.g., transceiver 20, FIG. 1A) is positioned on the substrate in electrical contact with conductors of the code circuit 16 (e.g., conductors 30, FIG. 7) in step 120. In various embodiments, step 110 includes disposing a circuit template over the substrate. This happens before the transceiver is disposed over the substrate (step 120). Step 120 includes disposing the transceiver pad-down over the template disposed over the substrate. That is, the transceiver includes electrical pads oriented facing the substrate to make electrical contact with the conductors of the circuit template. In various embodiments, as discussed above with reference to FIG. 11, steps 110 and 120 are performed by printing the conductors and the transceiver, e.g., using an inkjet printer or offset press. In various embodiments, the conductor(s) are printed on the substrate using the same printing process as the transceiver. That is, if offset printing is used for the transceiver, offset printing is used for the conductors, although the specific inks and materials used can differ between the two.

In various embodiments, the transceiver is an RFID transceiver. In optional step 119, an antenna is disposed over the substrate and connected to the transceiver.

Steps 100-120 (and optionally 119) are repeated with a plurality of substrates to make a plurality of electronic storage systems. In various embodiments, the respective transceivers in the storage systems are functionally identical. For example, they can all have the same part number. Step 110 forms a unique conductor pattern for each electronic storage system to give each one a unique ID or other information.

Figure 16:
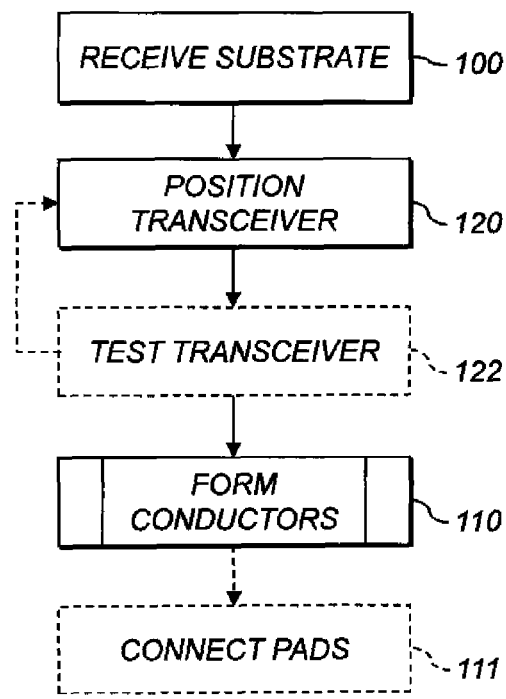

FIG. 16 shows methods of making an electronic storage system according to various embodiments. The substrate is received in step 100. The transceiver is positioned on the substrate step 120. After the transceiver is positioned, it is optionally tested (step 122). The transceiver can be tested using a probe card to contact input and output pads on the transceiver, by HAG, or by other test procedures. If the transceiver does not meet required functional specifications, it can be removed. Steps 120 and 122 can then be repeated until the positioned transceiver is a functional transceiver.

After the transceiver (or a functional, tested transceiver) has been positioned, the conductor(s) are formed as described with reference to step 110, FIG. 15 (step 110). The conductors are in electrical contact with the transceiver. The transceiver can be made separately from the electronic storage system 5. In various embodiments, the transceiver includes input and output electrical-connection pads, and the conductors formed or deposited in step 110 form a code circuit. In optional step 111, the input and output electrical-connection pads are electrically connected to the code circuit. Connection can also be made as part of conductor-forming step 110 or transceiver-positioning step 120. Seal 13 (FIG. 1A) can be disposed over system 5 (FIG. 1A) after step 110 or step 111.

Figure 17:
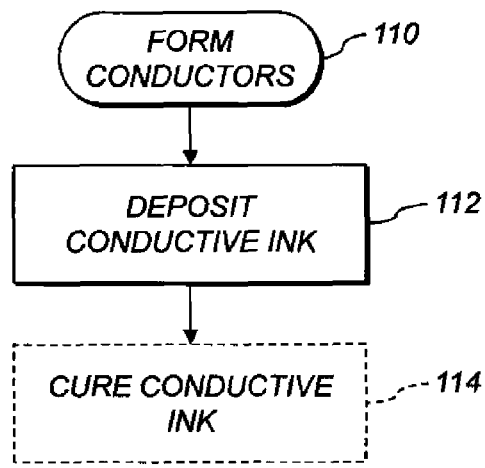
FIGS. 17-19 are flowcharts of methods of forming a code circuit according to various embodiments.

FIG. 17 shows ways of forming a code circuit (step 110 in FIG. 15 or 16) according to various embodiments. The code circuit can be formed by depositing electrically-conductive inks on or over the substrate to form at least a part of the code circuit (step 112). The conductive inks can be deposited with printing methods, including ink jet deposition methods. If seal 13 is deposited before step 110 is performed, openings can be left in seal 13 to receive conductive material. In optional step 114, the conductive materials are cured after deposition, e.g., by exposure to heat or to ultraviolet radiation. The various elements of the code circuit can be made by providing different amounts of conductive inks, e.g., to control the conductivity of the conductors or resistors (e.g., resistors 32, FIG. 7) formed. The elements can also be made by providing inks having different constituents or concentrations, or inks made of different materials. The elements of the code circuit can be formed by spatially patterning the conductors to form wires, capacitors, inductors, and chemical charge storage devices.

Figure 18:
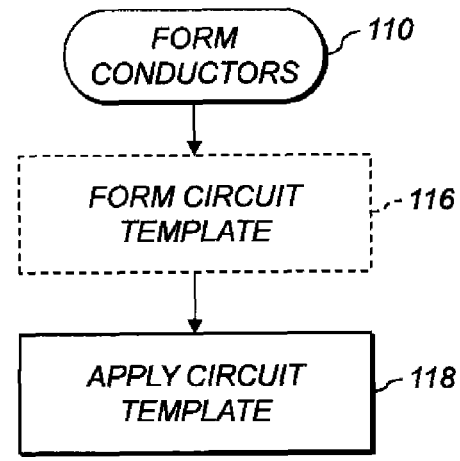

FIG. 18 shows ways of forming a code circuit (step 110 in FIG. 15 or 16) according to various embodiments. In optional step 116, a circuit template, such as a patterned conductive foil sheet, is formed. In step 118, the circuit template is affixed to the substrate to form at least a part of the code circuit. In some embodiments not using step 116, step 118 includes depositing the circuit template on the substrate, as discussed above. The circuit template can be made separately from the electronic storage system 5.

Figure 19:
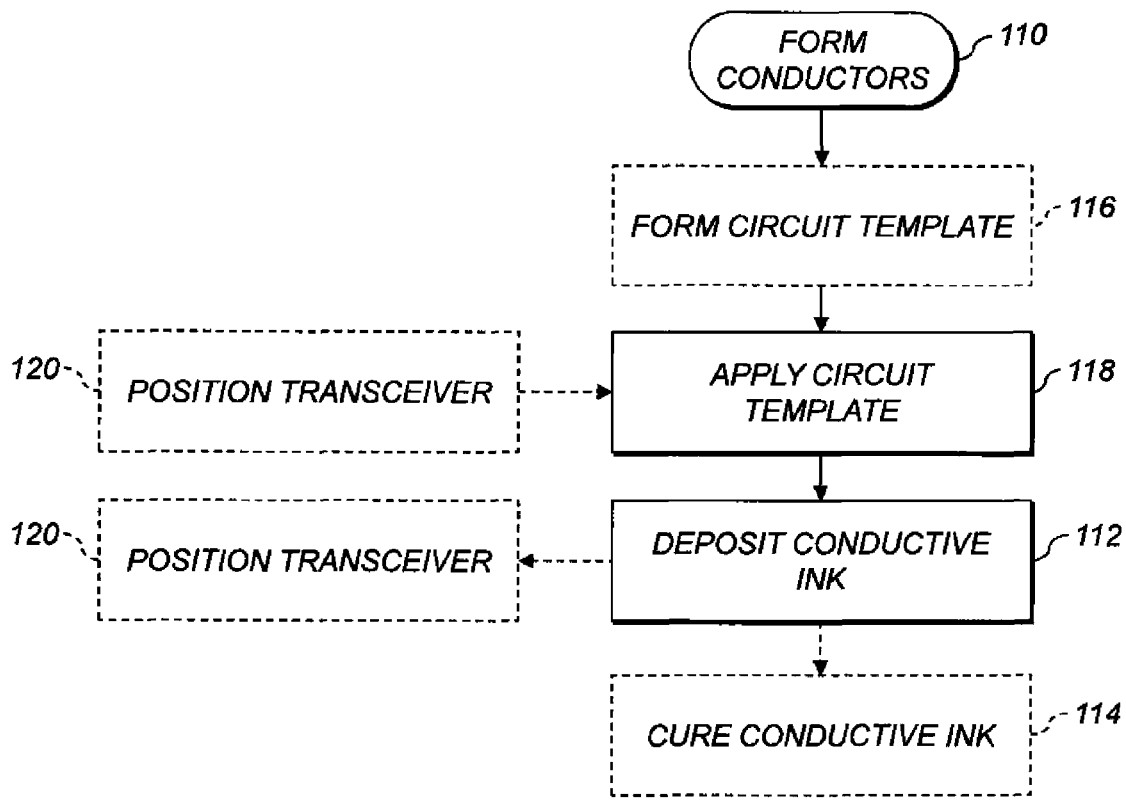

FIG. 19 shows ways of forming a code circuit (step 110 in FIG. 15 or 16) according to various embodiments. A circuit template forming only a portion of the code circuit 16 is formed in step 116. In step 118, the circuit template is disposed over or applied to the substrate. In some embodiments, the circuit template is formed directly on the substrate in step 118. As a result of disposing the circuit template over the substrate, at least one of the conductors of the circuit template is electrically connected to an output pad of the transceiver, and at least one of the conductors of the circuit template is electrically connected to each of one or more input pad(s) of the transceiver.

Electrically conductive inks are then deposited over the conductive foil in step 112, and optionally cured in step 114, to form a complete code circuit 16. In a particular embodiment, the conductive inks are applied in the sites 30D that define the information stored in the code circuit 16. In various embodiments, transceiver 20 is positioned on substrate 10 in step 120, which can be performed before step 118 or after step 112, as shown. Step 120 can also be performed before step 116 or after step 114.

In various embodiments, an electronic storage system is made by receiving a substrate and a transceiver (step 100, FIG. 16). The transceiver includes a transceiver substrate separate from the substrate, an output electrical-connection pad, a plurality of input electrical-connection pads, and a circuit template including a plurality of conductors. The transceiver and the circuit template are disposed over the substrate (steps 120, 118) so that at least one of the conductors of the circuit template is electrically connected to the output pad and at least one of the conductors of the circuit template is electrically connected to each of the input pads. In step 112, at least one electrically-conductive strap is printed so that each strap electrically connects the output pad to the at least one of the input pads through at least two of the conductors of the circuit template applied in step 118. In various embodiments, the transceiver includes more than one output electrical-connection pad. At least one of the conductors of the circuit template is electrically connected to each of the output pads, and the straps are printed so that each strap electrically connects at least one of the output pads to at least one of the input pads through at least two of the conductors of the circuit template applied in step 118.

Figure 20:
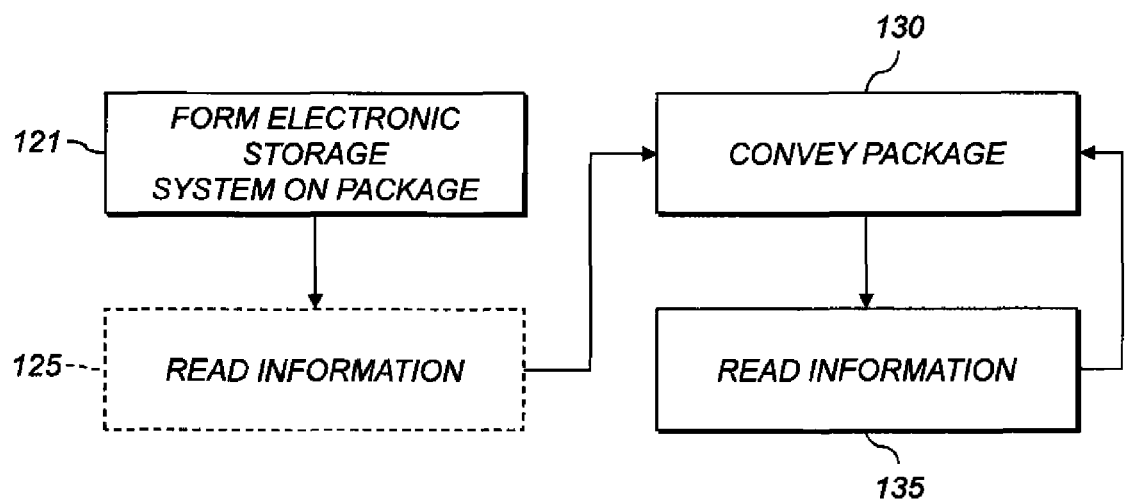
FIG. 20 is a flowchart according to various embodiments of methods of using the electronic storage system to track items or information about items.

FIG. 20 shows ways of using the electronic storage system to track items or information about items according to various embodiments. An electronic storage system (e.g., system 5, FIG. 7) can be used to provide access to information stored in the code circuit, for example, identification or instruction information. The information can be used as part of a tracking system. In step 121, an electronic storage system is formed on a product or package. In optional step 125, the information is read by a reader, e.g., for verification or database setup. In step 130, the package is conveyed to a selected location, e.g., a distribution center. In step 135, the information stored in the code circuit is read. The package or product can be repeatedly conveyed (step 130) and read (step 135) to track its location or status. In various embodiments, the information stored in the code does not change over a selected useful life of the electronic storage system.

Figure 21A:
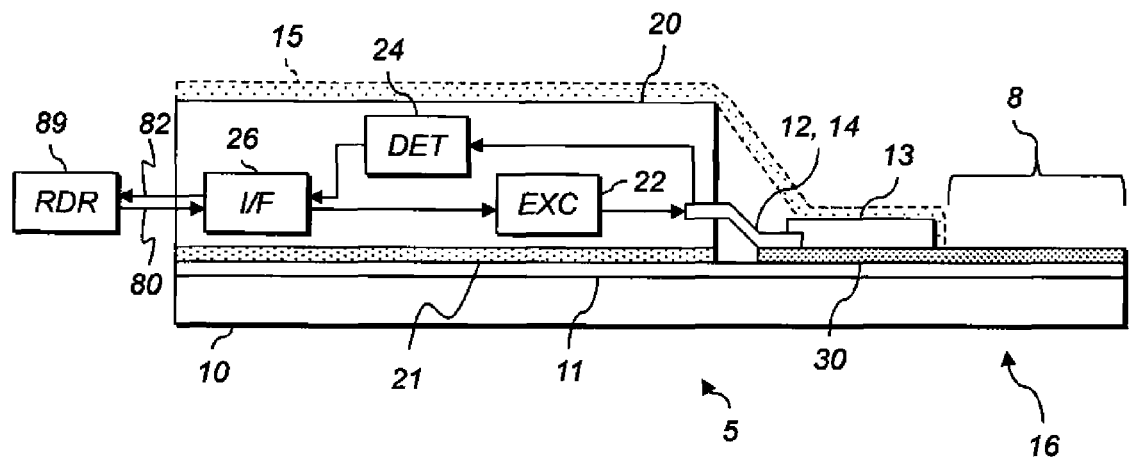
FIG. 21A is a side view of a schematic of an electronic storage system according to various embodiments.
Figure 21B:
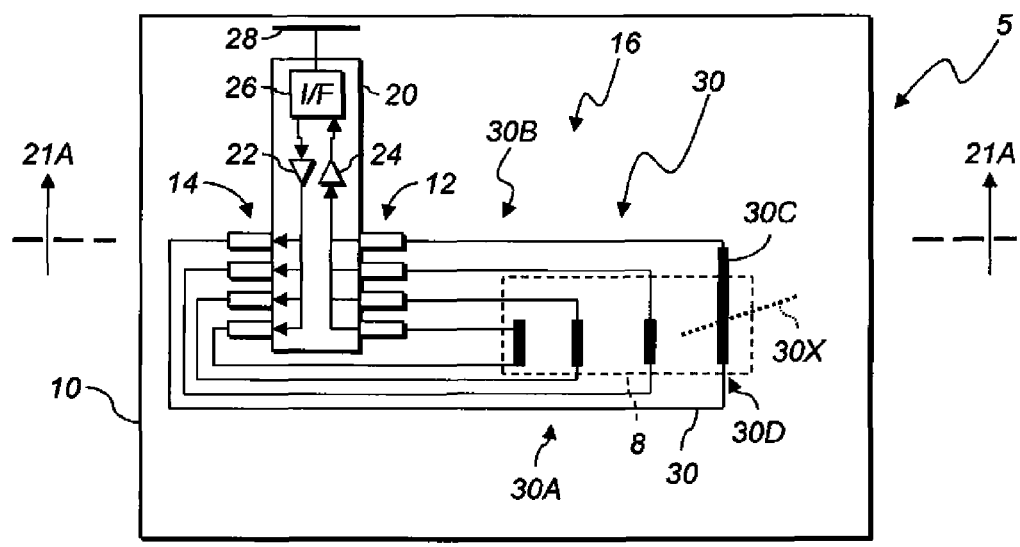
FIG. 21B is a plan view of a schematic of the electronic storage system of FIG. 21A.

FIG. 21A is a side view, and FIG. 21B a plan, of a schematic of electronic storage system 5 according to various embodiments. FIG. 21A is shown along the line 21A-21A in FIG. 21B, except for the components of transceiver 20. These components are shown schematically. Reader 89, uplink signal 82, downlink signal 80, transceiver 20, transceiver substrate 21, interface 26, detection circuit 24, excitation circuit 22, input pads 12, output pads 14, conductors 30, 30A, 30B, conductive strap 30C, site 30D, antenna 28, substrate 10, and planarization layer 11 are as shown in FIGS. 1A-1B, with variations described herein. System 5 can include a plurality of input pads 12 and respective detection circuits 24.

In these embodiments, code circuit 16 is purposefully changed at different points in its useful life. In various embodiments, code circuit 16 is separate from transceiver 20 and is disposed over substrate 10. Substrate 10 includes alteration region 8. Code circuit 16 includes conductor 30 disposed at least partly over substrate 10 in alteration region 8. In this example, conductor 30 includes one segment of a conductor 30A, strap 30C, and one segment of a conductor 30B. Strap 30C is located partially within alteration region 8 and partly outside it. Conductor 30 has a mechanical state and is adapted to permit external alteration of its mechanical state in alteration region 8. Alteration region 8 can include the entire code circuit 16 or only a portion thereof. Alteration region 8 can correspond to physical characteristics of substrate 10. For example, alteration region 8 can be defined by the absence of soldermask on a certain portion of a printed circuit board. Alteration region 8 can also be a defined area without any perceptible physical signs on substrate 10. Optional topcoat 15, e.g., a conformal coating, can coat transceiver 20 and portions of substrate 10 (and components thereon) outside alteration region 8 to protect against damage to components outside alteration region 8.

Code circuit 16 is adapted to electrically connect output pad 14 to input pad 12 so that detection circuit 24 detects an electrical state of input pad 12 in response to the excitation signal from excitation circuit 22 and the mechanical state of conductor 30. In response to a received downlink signal 80 from reader 89, interface 26 transmits uplink signal 82 representing the electrical state of input pad 12 (or the state(s) of at least some of a plurality of input pads 12). Since the electrical state of input pad 12 depends on the mechanical state of conductor 30, reader 89 can determine the mechanical state of conductor 30 through interface 26.

The mechanical state of conductor 30 includes those physical properties of the configuration of conductor 30 that affect its behavior when electrically energized. Mechanical state can include cross-sectional area, cross-sectional aspect ratio, overall length and width of the conductor, locations and shapes of bends or necks in the conductor path, sheet resistivity, material composition, and electrical continuity. For example, strap 30C (or another circuit component) can be electrically removed from code circuit 16 after code circuit 16 has been formed, e.g., by scoring substrate 10 in alteration region 8 along score line 30X. This breaks the electrical continuity across strap 30C, changing its mechanical state. In the example shown in FIG. 7, discussed above, scoring a strap 30C would change a 1 bit on input pad 12 to a 0 bit.

These embodiments can be useful, for example, when a package or product to which electronic storage system 5 is affixed (or with which system 5 is associated) experiences changes, e.g., in locations or in operational state. As the package or product moves from location to location or undergoes changes, the information stored in code circuit 16 can be modified to reflect the moves or changes. Moves or changes can be tracked by modifying code circuit 16 over time and reading the information from the code circuit periodically throughout that time. The mechanical state of conductor 30 can be accomplished in various ways.

In various embodiments, humans, e.g., equipment operators or shipping personnel, physically remove elements from the code circuit 16. In other embodiments, machines operated by humans or automated machinery physically remove elements from code circuit 16. Code circuit elements can be physically removed, e.g. by tearing, ripping, or scratching a circuit element such as a resistor or strap. Conductors can be electrically opened by scoring or cutting them transversely to the current flow with a knife or laser. Conductors or resistors can also be exposed to chemical etchants to open them. A resistor or conductor can be modified by passing a high-magnitude burn current through it to increase its impedance, or to create an electrical open circuit by overheating and physically burning the material composing the resistor or conductor. Conductive material can be removed from conductor 30 in alteration region 8, e.g., by scraping part off, to increase or decrease the impedance of a resistor by a finite amount, e.g., by +100 MΩ, instead of fully opening the resistor (∼∞Ω). In yet other embodiments, either humans, machines operated by humans, or automated machines are used to modify one or more elements, for example by changing the elements' conductivity, or to add new elements, for example by adding resistors 32 to sites 300 that have open sites 31 (all FIG. 7). Alternatively, a resistor 32 (or other circuit component) can be added to the code circuit 16 after the code circuit 16 has been formed. Generally, the mechanical state of the code circuit 16 can be altered by cutting, laser-cutting, cracking, displacing, etching, scratching, acid-etching, punching, bending, folding, spindling, mutilating, exploding, or removing at least part of conductor 30 in alteration region 8. In alteration region 8, a portion of conductor 30 is accessible to one of these alteration techniques. A portion of conductor 30 can also be separated from the rest of conductor 30, e.g., by electro-migration.

Figure 22:
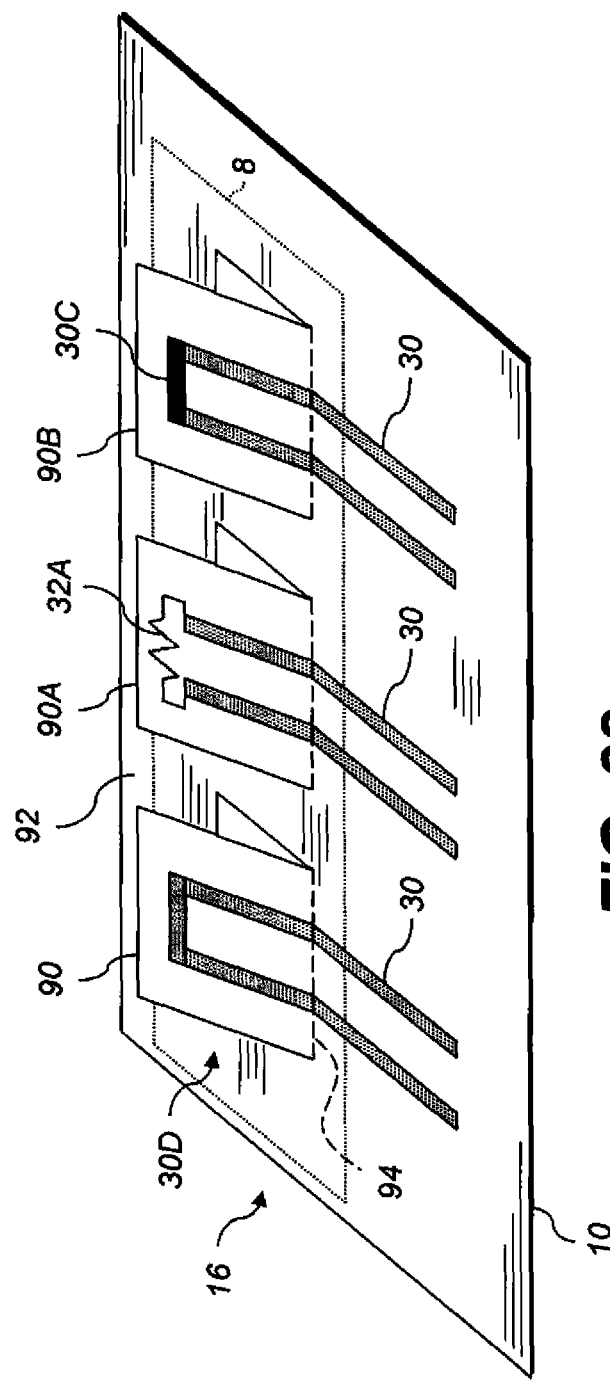
FIG. 22 illustrates removable portions according to various embodiments.

FIG. 22 illustrates removable portions 90, 90A, 90B according to various embodiments. Substrate 10 includes one or more removable portions 90, 90A, 90B and corresponding remaining portions 92. Code circuit 16 is disposed over substrate 10. Code circuit 16 has conductors 30 that extend into alteration region 8 and onto removable portions 90, 90A, 90B. Removable portions 90, 90A, 90B are attached to remaining portions 92 along perforations 94 that facilitate removal of the removable portions 90, 90A, 90B from substrate 10 and code circuit 16.

Conductors 30 are portions of code circuit 16. By removing removable portions 90, 90A, 90B, for example by ripping them off by hand at perforations 94, conductors 30 are interrupted (lose electrical continuity) (e.g., at sites 30D). This alters the mechanical state of the code circuit 16 and its electrical response to the excitation signal. The removable portion does not have to be completely removed; only the continuity of one or more conductors 30 has to be broken. Substrate 10, conductors 30, or both can be perforated with perforations 94.

Substrate 10 can include a plurality of removable portions 90, 90A, 90B of substrate 10, a plurality of corresponding remaining portions 92, and a plurality of conductors 30. Any of these can be located in whole or in part within alteration region 8. Each conductor 30 can correspond to one removable portion 90, 90A, 90B and one alteration region 8, or a plurality of either. Each conductor 30 can be connected to a respective input pad 12 of transceiver 20. In an example, substrate 10 includes a second alteration region (not shown). Conductor 30 is further disposed over the substrate 10 at least partly in the second alteration region. Conductor 30 in the second alteration region 8 is adapted to permit external alteration of its mechanical state.

Substrate 10 can also be scored to facilitate separating the removable portion at least partly from the remainder of substrate 10. In this example, removable portions 90, 90A, 90B are tabs that can be bent up or down out of the plane of substrate 10 as shown. In other examples, removable portions protrude from remaining portions 92 of substrate 10. For example, a removable portion (not shown) can be a tab protruding from the edge of an otherwise rectangular substrate 10. In another example, one or more removable portions of substrate 10 are removably affixed to substrate 10, e.g., as stickers, and can be peeled from substrate 10. In other embodiments, removable portions of substrate 10 are coplanar with remaining portions 92 and substrate 10. Removable portions of the substrate can then be punched from substrate 10.

The removal of removable portions 90 can be mechanically controlled. For example access can be provided only from a particular side or direction, or specific amounts of force can be required to be applied in selected directions.

Code circuit 16 can include conductors 30 having straps 30C, e.g., in removable portion 90B or elsewhere in alteration regions 8. In general, one or more strap(s) can be located in one or more alteration region(s). Removable portions 90, 90A, 90B can include other circuit elements such as resistors, capacitors, inductors, and batteries. Conductors 30 can also include resistors 32A, shown on removable portion 90A, disposed over the substrate in alteration region 8. In embodiments using a resistor ladder, at least one resistor 32A is in alteration region 8.

Referring back to FIG. 9, and still referring to FIG. 22, in various embodiments, code circuit 16 includes a resistor ladder having a plurality of resistors 32A, 32B, 32C, 32D, 32E connected in parallel. The resistors 32A, 32B, 32C, 32D, 32E can be located in any combination of alteration regions 8 and removable portions 90, 90A, 90B. For each resistor of resistors 32A, 32B, 32C, 32D, 32E, either that resistor is located in an alteration region 8, or a conductor connecting that resistor to conductors 30R or 30P is located in an alteration region 8. One or more of the resistors 32A, 32B, 32C, 32D, 32E in the resistor ladder can be altered to change the mechanical state of the conductor.

In the example shown in FIG. 9, resistor 32A is connected to conductor 30P in alteration region 8E. In this way, when the mechanical state of the conductor(s) in alteration region 8E is changed, the resistance contribution of resistor 32A to the ladder changes. For example, if conductor 30P is cut in alteration region 8E, resistor 32A is disconnected from the ladder, and the parallel resistance $R_{EQUIV}$ of the ladder changes. In various embodiments, the electrical state is a digital state. Each alteration region 8 or removable portion 90 corresponds to at least one bit of the digital state.

Referring back to FIG. 7, in other embodiments, conductive elements are added at sites 30D (for example, in place of open sites 31) to alter the electrical response of code circuit 16 to an excitation signal. For example, conductor 30P in alteration region 8 can include exposed conductive material. This exposed material can receive additional conductive material to decrease the impedance of the conductor. Such conductive elements can be provided by stamping conductive materials onto the substrate 10 and into the code circuit 16, or by inkjet depositing conductive material into the sites 30D, which can be wholly or partly in alteration region(s) 8. The added conductive material can form a strap 30C (not shown). Specifically, the conductor (here, conductor 30P, conductor 30R, and site 30D between them) connects first and second pads on the transceiver (here, output pad 14P and input pad 12). Additional conductive material is disposed over the substrate 10. The new material is electrically connected to the first and second pads.

In various embodiments, the electrical state is a digital state, and each input pad is responsive to a single bit of the digital electrical state. The mechanical state of each conductor has two possible values so that each detection circuit detects a respective electrical state having two possible values, for example by comparing a detected voltage or current value to a threshold value. The uplink signal can include a respective payload bit representative of the respective electrical state of each input pad. The payload bit can be only one bit per pad, but other payload bits can be derived after error-correction and encoding processes are applied. Encoding and error-correction methods are known in the art.

Figure 23:
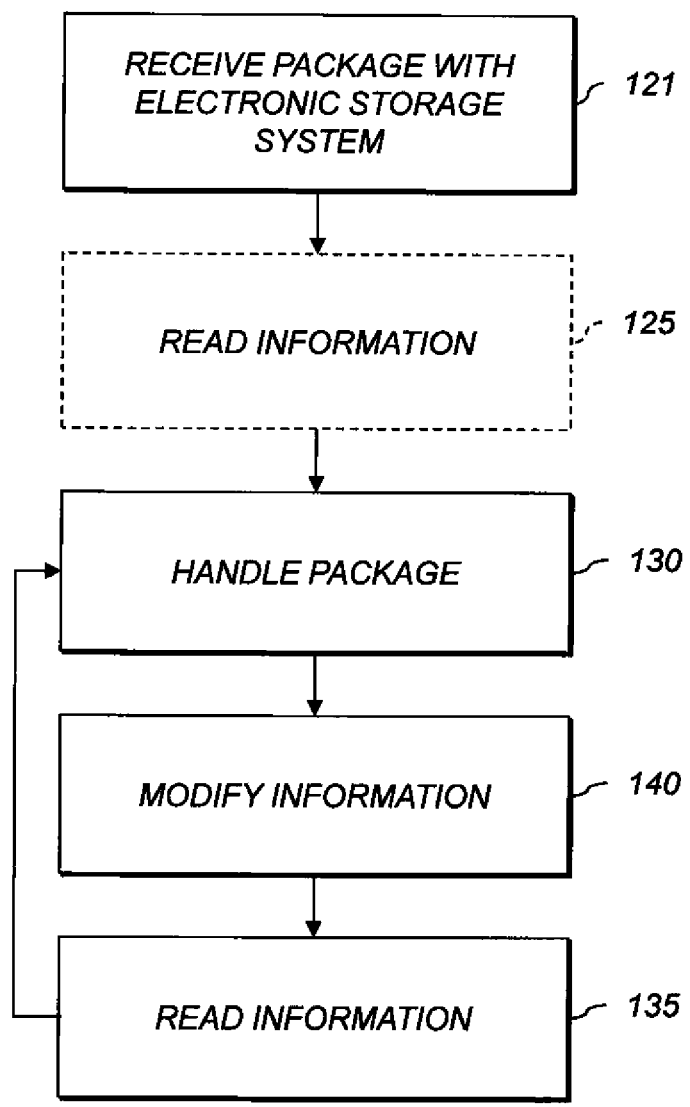
FIG. 23 is a flowchart according to various embodiments of methods of using the electronic storage system to track items or information about items.

FIG. 23 is a flowchart according to various embodiments of methods of using the electronic storage system to track items or information about items. Code circuit 16 is mechanically altered over time to change the information stored in the code circuit, for example, to provide updates or status information. In step 121, a package is received that includes an electronic storage system including a code circuit (e.g., electronic storage system 5 shown in FIGS. 21A-21B). These embodiments can also apply to an instance of a product not in a package, but with which an electronic storage system is associated. The system includes a substrate with an alteration region and a transceiver, e.g., as described above with reference to FIGS. 21A-21B. The information is read in optional step 125.

The package is then handled (step 130). In an example, the package is conveyed to a desired location. In another example, the package is moved along an assembly line from one station to another. In step 140, the code circuit is modified. Specifically, a modification is made to the mechanical state of a conductor of the code circuit in the alteration region of the substrate. The information is read in step 135 to understand the lifecycle of the product or package. The package or product can be repeatedly handled, conveyed, modified, and read to track its location by repeating steps 130, 140, and 135.

Figure 24:
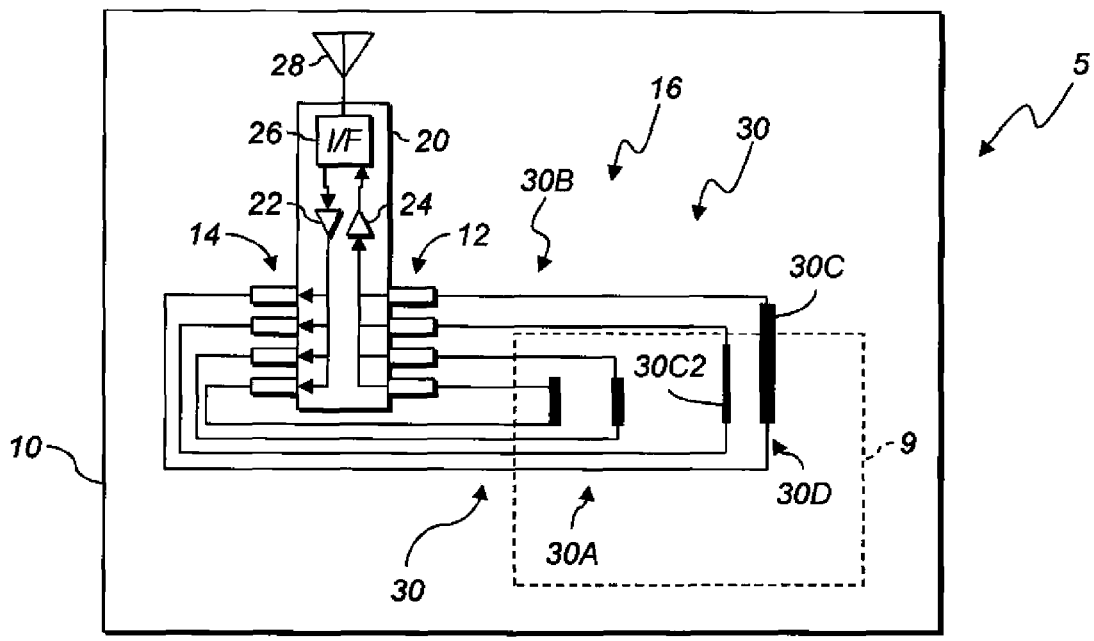
FIG. 24 is a plan view of a schematic of an electronic storage system according to various embodiments.

FIG. 24 is a plan view of a schematic of an electronic storage system according to various embodiments. Code circuit 16 is not intentionally modified as discussed above, e.g., in step 140 (FIG. 23). Rather, environmental factors are permitted to modify the electrical or mechanical state of code circuit 16. Electronic storage system 5, substrate 10, transceiver 20, interface 26, detection circuit 24, excitation circuit 22, input pads 12, output pads 14, conductors 30, 30A, and 30B, conductive strap 30C, site 30D, and antenna 28 are as shown in FIG. 21B, with variations described herein. Substrate 10 includes detection region 9. As with alteration region 8 (FIG. 21A), detection region 9 can be differentiated from the rest of substrate 10 by physical properties, or not.

Conductor 30 has an electrical state, e.g., an impedance. In various embodiments, the electrical state of conductor 30 is associated with its mechanical state. In various embodiments, the electrical state of conductor 30 is an electrical property, e.g., conductivity. The electrical state of conductor 30 is determined by the electrical states of the conductive elements that compose conductor 30, e.g., conductors 30A, 30B and strap 30C. Detection circuit 24 detects an electrical state of input pad 12 in response to the excitation signal from excitation circuit 22 and in response to the electrical state of conductor 30. Conductor 30 is disposed over the substrate 10 at least partly in detection region 9, and is part of code circuit 16. Transceiver 20 transmits an uplink signal (signal 82, FIG. 21A) representing the electrical state of input pad 12.

Conductor 30 is adapted to change electrical state (or mechanical state) in response to an environmental factor or stress. Once the environmental factor(s) have modified the electrical state of conductor 30, the response of the code circuit 16 to an excitation signal will be likewise modified. The change in response can be compared to an earlier response to identify a change and the change can be correlated with environmental factors known to cause such a change.

To reduce the effects of environmental changes to components other than conductors 30, 30A, 30B in detection region 9, the remainder of the code circuit 16 can be sealed, for example with seal 13 or topcoat 15 (FIG. 21) disposed over substrate 10 outside detection region 9. Seal 13 and topcoat 15 keep a portion of code circuit 16 or transceiver 20 from exposure to the environment.

In various embodiments, substrate 10 also serves to encapsulate transceiver 20 to protect it from environmental stresses. Conductors 30 electrically connect transceiver 20 encapsulated by topcoat 15 and substrate 10 to code circuit 16 outside topcoat 15.

Other elements in the code circuit 16 can also be affected by environmental factors, for example resistors, capacitors, inductors, and chemical charge storage devices. In an example, a resistor in detection region 9 changes impedance in response to any of the environmental factors listed herein, or changes in any of them. In another example, the conductivity or charge storage ability of elements in the code circuit 16 changes with exposure to environmental factors.

In an alternative embodiment, conductor(s) 30 are further adapted to change electrical state in response to a change in the environmental factor. For example, the electrical state of conductor(s) 30 can be responsive to the rate of change in concentration of a contaminant, rather than the level of concentration of that contaminant. Thus, the change in response of the code circuit 16 indicates a change in the environmental factor from one state to another, for example a concentration of a chemical compound, either liquid or gas, to which the conductor 30 is exposed.

The environmental factor can be temperature, humidity, pressure, or pH of a fluid. The environmental factor can also be acceleration, altitude, mechanical abrasion, or capacitance or inductance of conductor(s) 30. The environmental factor can also be a chemical reaction to fluids or gases. The environmental factor can also be a mechanical stress or strain, such as that induced during abrasion, cutting, or punching, in response to mechanical forces of various strengths and velocities.

The environmental factor can also be the presence or absence of a substance in the fluid (e.g., a specific virus or chemical). In various embodiments, the substance is a chemical, organism, microorganism, or virus. The fluid can be a bodily fluid (e.g., blood, lymph, urine, or bile). In various embodiments, the environment is the environment of a living organism, such as a human body or animal. In various embodiments, the storage system is used to track environmental factors in humans. A person can swallow an implementation of electronic storage system 5 that passes into the gastro-intestinal tract, or the implementation can be injected in the blood stream or into an organ.

In various embodiments, components of code circuit 16 are designed so that different elements respond differently to environmental factors. In this example, straps 30C, 30C2 have different line widths. As a result, exposure to a corrosive atmosphere will corrode through strap 30C2, opening it, before strap 30C corrodes through and opens. More than two straps can be used. The sizes and compositions of the straps can be designed so that, when multiple straps are exposed to a hostile environment beginning at the same time, the straps will fail in a desired sequence or with desired time intervals between failures. The desired time intervals can be equal or be elements of an arithmetic, geometric, logarithmic, or other regular sequence.

In various embodiments, one or more conductor(s) 30 includes conductive material that reduces in conductivity as it is exposed to the environmental factor. Conductivity reductions can result from chemical changes in the conductive material or from loss of the material to a reaction with the environment. Chemical changes can include changes in the composition of conductor 30 from one material to another, catalyzed by the environmental factor or brought about through reactions between the initial material and the environmental factor. In various embodiments, conductor 30 is made as thin as possible without losing structural integrity. This increases the surface area over which reactions with the environmental factor can take place.

Opening of straps 30C, 30C2, or changes in conductivity of conductor(s) 30, changes the electrical state measured by detection circuit 24 over time and provides information with respect to the environmental stresses over time. Some conductors 30 can be thicker or thinner than other conductors 30, or can include different materials having different susceptibilities to an environmental stress or to different environmental stresses.

In various embodiments, code circuit 16 includes a plurality of conductors 30, each connecting an input pad 12 to an output pad 14. Each of the conductors 30 has a respective, different susceptibility to the environmental factor, so that each conductor changes electrical state at a respective, different time under uniform exposure to the environmental factor. The conductors can have the same geometry or different geometries. In various embodiments, detection circuit 24 includes a timer (not shown) adapted to measure the respective, different times, or the intervals between them, and provide the measured times or intervals to interface 26. The timer can include an oscillator or CMOS clock driving a counter.

"Susceptibility" is the extent to which or rate at which a selected environmental factor affects the physical properties or electrical state of conductor 30. In an example, the environmental factor is a solvent (e.g., aqua regia) that dissolves the material of conductor(s) 30 (e.g., gold). The susceptibility can be expressed using the rate of dissolution in kg/s for a given mechanical configuration, or the diffusion coefficient in $m^2/s$, or intrinsic dissolution rate in $kg/(m^2 \cdot s)$. In another example, the environmental factor is a fluid (liquid or gas), and conductor 30 corrodes in the fluid. The susceptibility can be expressed as the current density of a polarization curve at the extrapolated point where the curve meets the corresponding equilibrium potential. This density is correlated with the rate of corrosion.

In various embodiments, electronic storage system 5 is exposed to or in mechanical contact with environmental fluids, e.g., the atmosphere or hydrosphere. Code circuit 16 includes a portion whose electrical state (e.g., impedance) is responsive to humidity, temperature, mechanical abrasion, or air pressure, or a portion having an electrical response to mechanical stress. In various embodiments, code circuit 16 includes a stress sensor (not shown) that produces an electrical response to mechanical stress.

Figure 25:
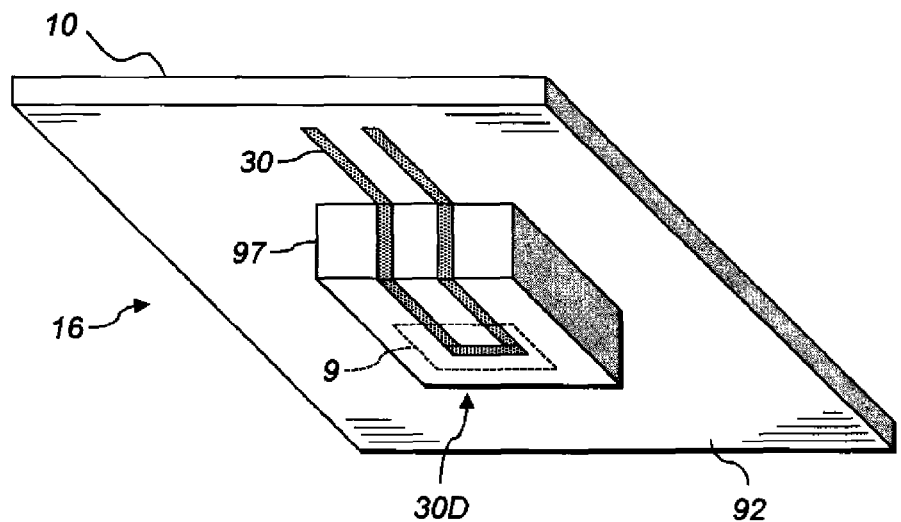
FIG. 25 illustrates detection regions according to various embodiments.

FIG. 25 illustrates detection regions according to various embodiments. Similarly to embodiments discussed above with reference to FIG. 22, substrate 10 includes detection portion 97 and remaining portion 92. Detection area 9 is disposed over detection portion 97, and conductor 30 is at least partly in detection area 9. Detection portion 97 can protrude from remaining portion 92. In this example, detection portion 9 protrudes downward and conductor 30 is adapted to mechanically contact a fluid (liquid or gas). For example, the system can be suspended over, or float on the surface of, a container of liquid or gas.

Referring back to FIG. 16, in various embodiments, an electronic storage system is made by receiving or providing a substrate with a detection or alteration region (step 100). A transceiver formed on a transceiver substrate separate from the substrate is affixed to the substrate (step 120). The transceiver includes an output electrical-connection pad, an excitation circuit adapted to provide an excitation signal to the output pad, an input electrical-connection pad, and a detection circuit connected to the input pad.

In step 110, conductors are formed or disposed over the substrate. The conductors compose part or all of a code circuit separate from the transceiver. At least one conductor is disposed at least partly over the substrate in the detection or alteration region. The conductor has an electrical state, as discussed above. The code circuit electrically connects the output pad to the input pad, so that the detection circuit detects an electrical state of the input pad in response to the excitation signal and the electrical state of the conductor. The conductor is adapted to change electrical state in response to an environmental factor. The transceiver further includes an interface responsive to a downlink signal to transmit an uplink signal representing the electrical state of the input pad. In step 111, the output electrical-connection pads and input electrical-connection pads are electrically connected to the code circuit.

In another embodiment, the code circuit 16 is modified over time to change the information stored in the code circuit in response to environmental factors such as the world environment or the environment found in biological organisms, including humans.

Figure 26:
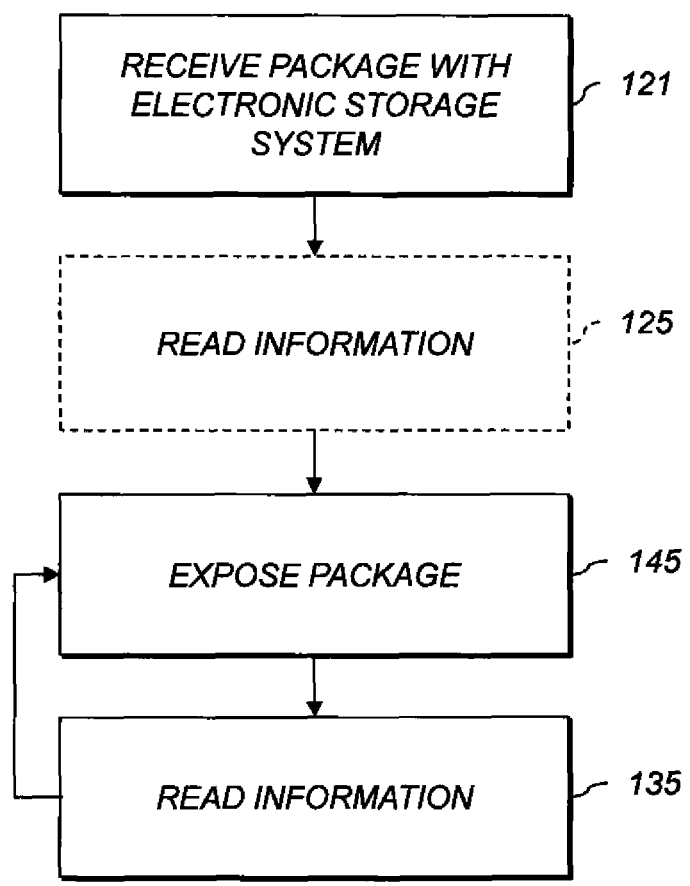
FIG. 26 is a flowchart according to various embodiments of methods of using the electronic storage system to track items or information about items.

FIG. 26 is a flowchart according to various embodiments of methods of using the electronic storage system to track items or information about items. A package is received having an electronic storage system formed or deposited thereon (step 121). In optional step 125, information representing the state of the code circuit in the system is read. In step 145, the package is exposed to environmental stresses, e.g., as discussed above. State information is read in step 135 to determine the environmental factors. The package or product can be repeatedly exposed and read by repeating steps 145 and 135. The results of multiple reads can be stored and compared.

Figure 27:
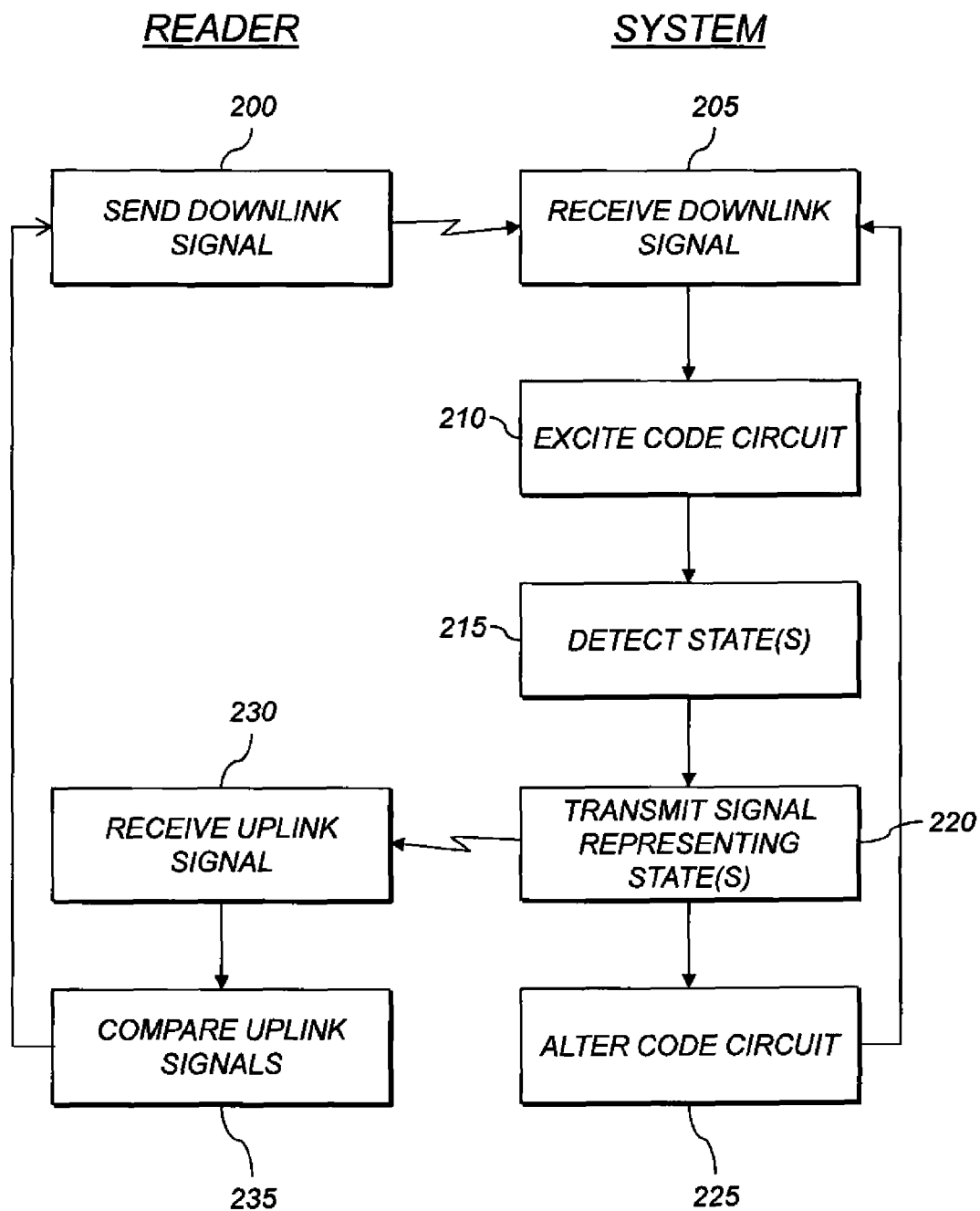
FIG. 27 is a flowchart according to various embodiments of methods of using the electronic storage system to track items or information about items.

FIG. 27 is a flowchart according to various embodiments of ways of using an electronic storage system to track items or information about items. The flowchart shows communications between a reader (e.g., reader 89, FIG. 1A; "READER"), such as an RFID reader, and an electronic storage system ("SYSTEM"). In step 200, the reader sends a downlink signal to the electronic storage system (e.g., system 5, FIG. 21A). The system receives the signal (step 205). In response, in step 210, the system excites its code circuit (e.g., code circuit 16, FIG. 21A; excitation circuit 22 of FIG. 21A can be used). Electrical states of the code circuit, e.g., of input pads connected to the code circuit, are detected in step 215. A signal representing the detected electrical states is transmitted back to the reader in step 220. The reader receives the transmitted signal in step 230.

The code circuit is then altered (step 225) to change the electrical or mechanical state(s) of the code circuit or one or more conductor(s) therein. As described above, the alteration can be performed deliberately (e.g., as shown in FIG. 23), or by exposure to an environmental condition (e.g., as shown in FIG. 26). The system then returns to step 205 to wait for another downlink signal. Once the reader has received two uplink signals, the received uplink signals can be compared (step 235) to detect changes in the state(s) of the system. A report of state changes can be communicated to an operator or other individual, or an automated controller, by communication media including a computer network, telephone, email, or pager.

In various embodiments, conductor 30 can be both modified by environmental factors and accessible to manual alteration. Detection region 9 and alteration region 8 are both defined on substrate 10. The regions 8, 9 can overlap or not. Conductor 30 can pass through both regions, or different conductors 30A, 30B or straps 30C can pass through only one region, or any combination.

Figure 28:
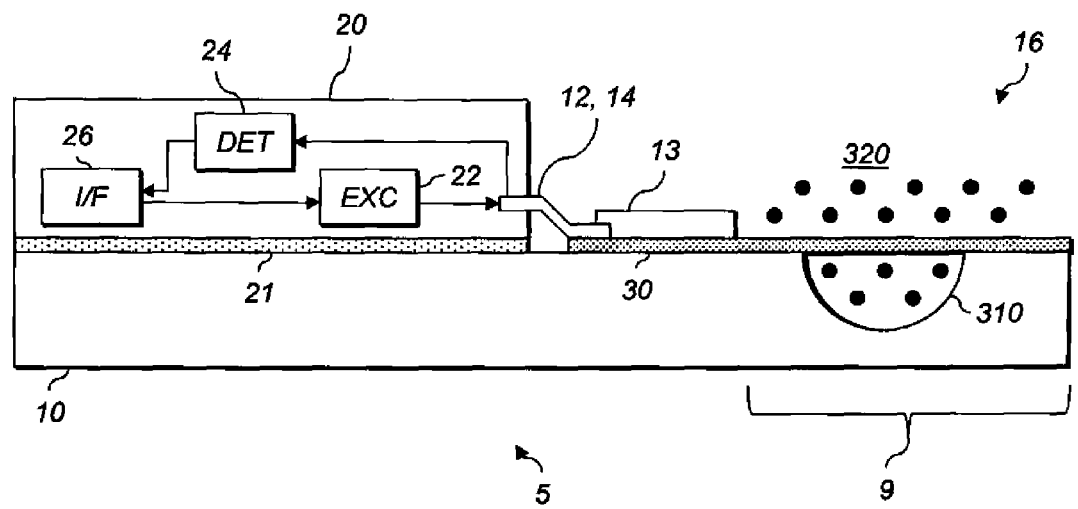
FIGS. 28-29 are side views of a schematic of an electronic storage system according to various embodiments for detecting pressure or pressure changes.
Figure 29:
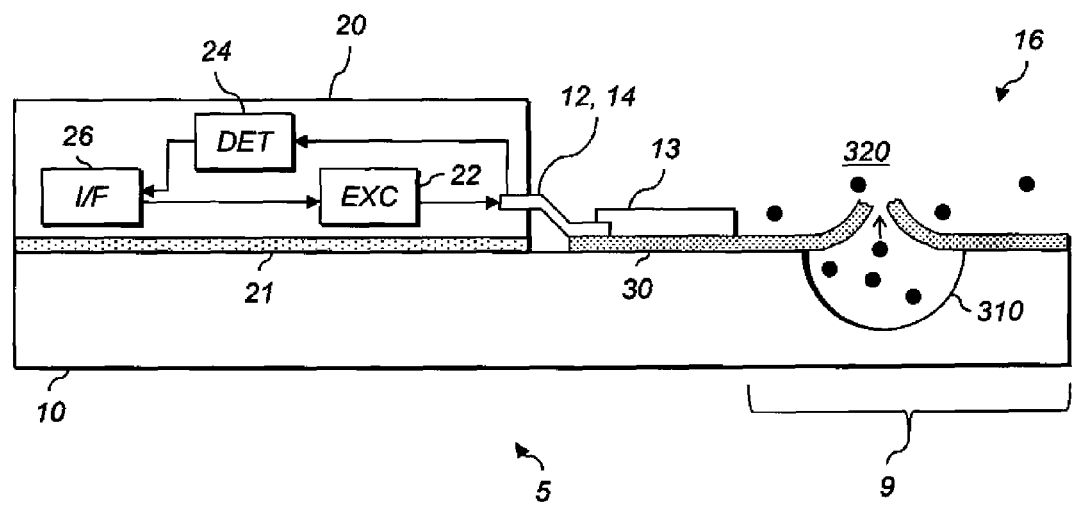

FIGS. 28-29 are side views of a schematic of electronic storage system 5 according to various embodiments for detecting pressure or pressure changes. In both FIG. 28 and FIG. 29, transceiver 20, interface 26, detection circuit 24, excitation circuit 22, input electrical-connection pad 12, output electrical-connection pad 14, substrate 10, and detection region 9 are as shown in FIG. 24. Transceiver substrate 21 and seal 13 are as shown in FIG. 21A.

FIG. 28 shows code circuit 16 including conductor 30 disposed over substrate 10. Substrate 10 includes chamber 310 in detection region 9. Chamber 310 is sealed by disposed conductor 30. That is, conductor 30 and substrate 10 (and optional gasket material, not shown) form a gas-tight seal that substantially prevents the contents of chamber 310 from being exchanged with the atmosphere. As a result, chamber 310 has vacuum (i.e., a selected pressure of approximately zero Torr) or a selected gas at a selected pressure sealed therein. Pressure is represented graphically in FIG. 28 by the density of black circles. In this example, the pressure in chamber 310 is approximately equal to the pressure in environment 320. When the pressure in chamber 310 is within a selected threshold of the pressure in environment 320, conductor 30 is undisturbed. In various examples, chamber 310 contains air, HEPA-filtered (cleanroom) air, a noble gas (e.g., argon or helium), or dry nitrogen gas at 1 atm.

FIG. 29 shows system 5 of FIG. 28 after a decrease in pressure in environment 320. The higher pressure inside chamber 310 burst conductor 30 (also referred to herein as opening chamber 310), venting chamber 310 to environment 320. This changed the electrical state (specifically, the impedance) of conductor 30 in code circuit 16, so detection circuit 24 can determine that the pressure has changed. Conductor 30 can be punctured by pressure, in which case its impedance increases due to the loss of cross-sectional area for current flow. Conductor 30 can also be torn through by the pressure, in which case it opens (loses continuity). An increase in pressure in environment 320 can burst conductor 30 inward, permitting detection of pressure changes in either direction. In an example, chamber 310 is sealed to contain vacuum or near-vacuum, and system 5 is used in a vacuum chamber or in space. Opening of chamber 310 indicates that vacuum is not being maintained.

The selected threshold of pressure referred to above is controlled by selecting the composition and geometry of conductor 30 over chamber 310, and the way of attaching conductor 30 to substrate 10 (e.g., using adhesive or not). The mechanical properties of conductor 30 are selected so it will burst when a pressure difference of interest is present. The gas and pressure in chamber 310 are also selected to control the selected threshold. A single substrate 10 can include multiple chambers 310. Conductor 30 can have seal chamber 310 or multiple chambers 310. Each chamber 310 can have a different pressure or gas composition so that each chamber 310 bursts conductor 30 at a corresponding pressure in environment 320. In various embodiments, multiple chambers 310 are sealed by a single conductor 30. Each chamber 310 opens at a respective, different pressure in environment 320. Therefore, as the pressure in environment 320 gradually changes, conductor 30 will progressively change electrical state, e.g., by progressively increasing impedance as each chamber 310 opens. In an example, the chambers 310 are arranged transverse to the direction of current flow across a narrow neck in conductor 30. As each chamber 310 opens, the cross-sectional area of current flow in conductor 30 decreases and its impedance increases.

Figure 30:
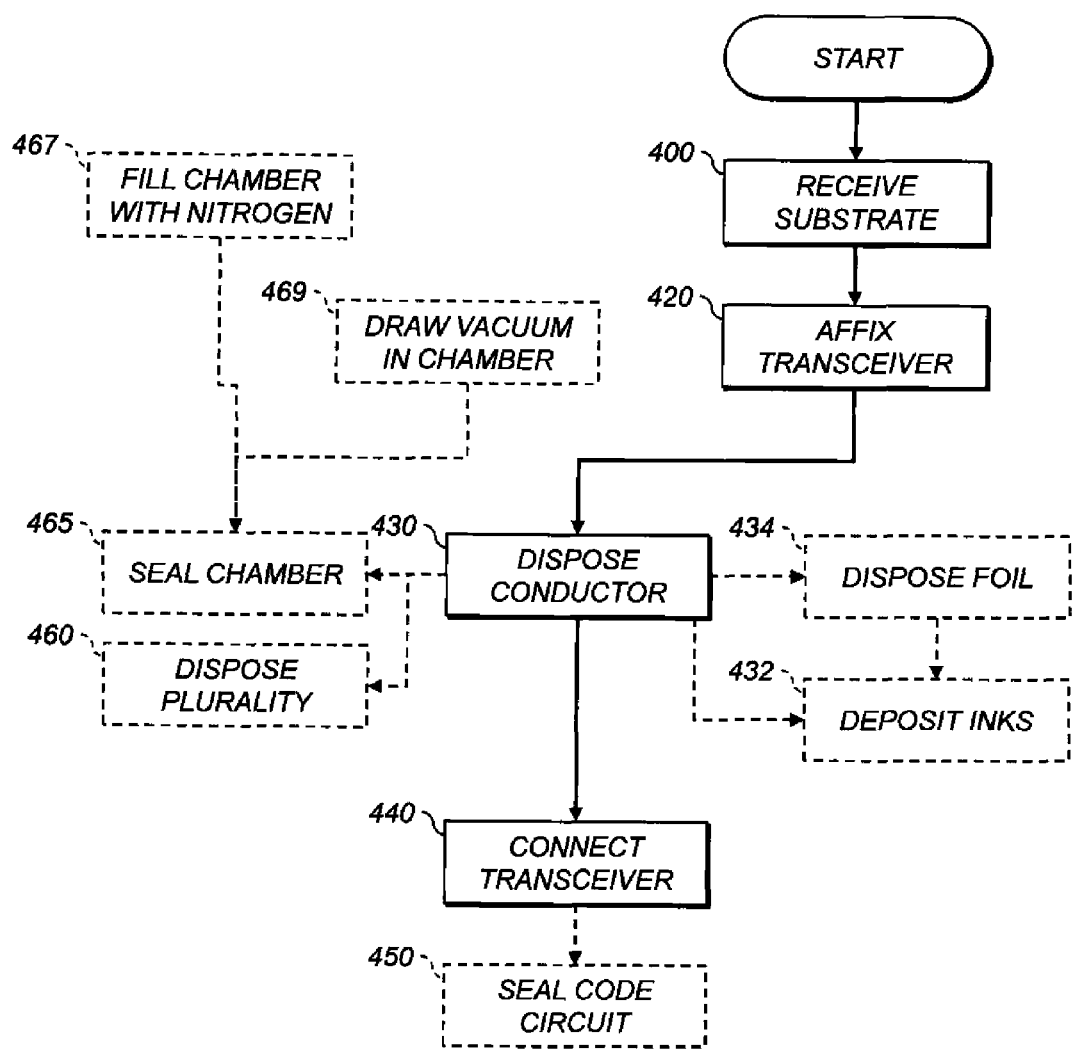
FIG. 30 is a flowchart according to various embodiments of methods of making an electronic storage system.

FIG. 30 shows methods of making an electronic storage system according to various embodiments. Processing begins with step 400.

In step 400, a substrate with a detection region is received. This can be substrate 10 (FIG. 24 or 28). Step 400 is followed by step 420.

In step 420, a transceiver, which is formed on a transceiver substrate separate from the substrate, is affixed to the substrate. This can be transceiver 20 (FIG. 24 or 28). The transceiver includes an interface. Step 420 is followed by step 430.

In step 430, a code circuit separate from the transceiver is disposed over the substrate. The code circuit includes a conductor disposed over the substrate at least partly in the detection region. The conductor has an electrical state that changes in response to an environmental factor. The interface in the transceiver selectively transmits an uplink signal representing the electrical state of the conductor. In various embodiments, step 430 includes optional steps 432, 434, or 460, or is followed by optional step 465.

In optional step 434, a conductive foil is disposed over the substrate to form at least a part of the code circuit. Step 434 is optionally followed by optional step 432.

Optional step 432 can be performed with or without performing step 434 first. In step 432, electrically-conductive inks are deposited on the substrate. This step can be used to produce systems such as those shown in FIG. 24. Conductive inks can be used to form straps 30C, 30C2 (both FIG. 24). In various embodiments, step 432 is performed before step 434, and step 434 includes disposing foil over the wet ink to form electrical connections.

In optional step 460, a plurality of conductors is disposed over the substrate. Each conductor has a respective, different susceptibility to the environmental factor. In various embodiments, the susceptibilities are selected so that the respective, different times are elements of an arithmetic, geometric, logarithmic, or other regular sequence. In various embodiments, the transceiver includes a detection circuit having a timer adapted to measure the respective, different times, or the intervals between them, and provide the measured times or intervals to the interface.

Optional step 465 relates to embodiments in which the substrate includes a chamber in the detection region (e.g., chamber 310, FIG. 28). In step 465, the conductor is disposed over the chamber to seal the chamber gas-tight. Optional steps 469 or 467 can be performed before step 465, preferably before step 430.

In step 469, vacuum is drawn in chamber before disposing the conductor over the chamber. Step 469 is followed by step 465.

In step 467, the chamber is filled with nitrogen gas before disposing the conductor over the chamber. In various embodiments, the chamber is filled with a noble gas, e.g., argon or helium, before disposing the conductor over the chamber. Step 467 is followed by step 465.

In step 440, the transceiver is electrically connected to the code circuit. The transceiver can therefore detect the electrical state of the conductor. The transceiver then transmits information about the electrical state of the conductor in the code circuit using the interface.

In various embodiments, the transceiver includes an output electrical-connection pad, an excitation circuit adapted to provide an excitation signal to the output pad, an input electrical-connection pad, and a detection circuit connected to the input pad. The code circuit electrically connects the output pad to the input pad, so that the detection circuit detects an electrical state of the input pad in response to the excitation signal and the electrical state of the conductor. In these embodiments, step 440 includes electrically connecting the output electrical-connection pads and input electrical-connection pads to the code circuit. Step 440 can be followed by optional step 450.

In optional step 450, the code circuit outside the detection region is sealed after the electrically-connecting step to keep the sealed portion from exposure to the environment. Sealing can be performed, e.g., by applying topcoat 15 (FIG. 21A).

Figure 31:
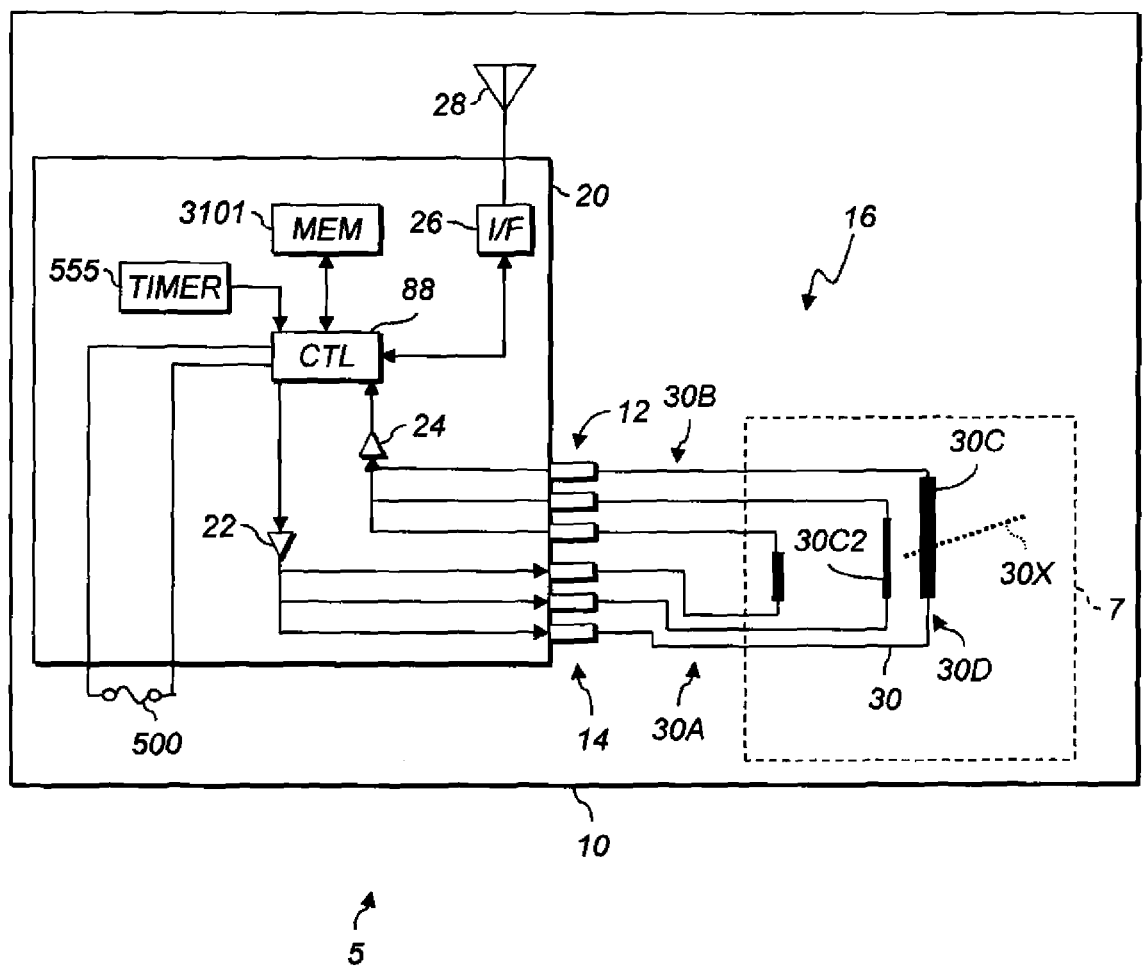
FIG. 31 is a plan view of a schematic of an electronic storage system according to various embodiments.

FIG. 31 is a plan view of a schematic of an electronic storage system according to various embodiments. Code circuit 16 can be intentionally modified, e.g., as discussed above in step 140 (FIG. 23), or modified by environmental factors, e.g., as discussed above in step 145 (FIG. 26). Electronic storage system 5, substrate 10, transceiver 20, interface 26, detection circuit 24, excitation circuit 22, input pads 12, output pads 14, conductors 30, 30A, and 30B, site 30D, and antenna 28 are as shown in FIG. 21B, with variations described herein. Conductive straps 30C, 30C2 are as shown in FIG. 24, and controller 88 as shown in FIG. 1A, with variations described herein. Score line 30X is as shown in FIG. 21B.

Substrate 10 includes state region 7. As with alteration region 8 (FIG. 21A), state region 7 can be differentiated from the rest of substrate 10 by physical properties, or not. As described above, transceiver 20 includes output electrical-connection pad(s) 14, excitation circuit 22 adapted to provide an excitation signal to output pad(s) 14, input electrical-connection pad(s) 12, detection circuit 24 connected to input pad(s) 12, and interface 26. As shown in FIG. 1C, interface 26 can communicate via antenna 28, pads and pogos, or other communication-channel devices. Interface 26 can also include a cable connector, e.g., a 9-pin D-sub, USB B, or 10BASE-T RJ-45 connector, and communicate with reader 89 (FIG. 1A) by a direct cable connection between the two.

Transceiver 20 also includes controller 88 connected to excitation circuit 22, detection circuit 24, interface 26, and memory 3101. Memory 3101 can be a volatile memory with battery back-up, or a nonvolatile memory such as an NVRAM, FRAM, PROM, EPROM, EEPROM, or Flash memory.

Code circuit 16 is separate from transceiver 20 and is disposed over substrate 10. Code circuit 16 electrically connects output pad(s) 14 to input pad(s) 12. Code circuit 16 includes conductor 30 disposed over substrate 10 at least partly in state region 7. Conductor 30 has an electrical state and a mechanical state. Conductor 30 in state region 7 is adapted to permit external alteration of its electrical or mechanical state, as is discussed below. As a result, detection circuit 24 detects an electrical state of input pad(s) 12 in response to the excitation signal from excitation circuit 22 and in response to the electrical or mechanical state of conductor 30.

In various embodiments, topcoat 15 (FIG. 21A) is applied. Topcoat 15 seals code circuit 16 outside state region 7 to keep the sealed portion from exposure to the environment.

Controller 88, at intervals, detects the electrical state of one or more of the input pad(s) 12 using excitation circuit 22 and detection circuit 24. Controller 88 stores the detected state or a representation thereof in memory 3101. Interface 26 is responsive to a downlink signal from reader 89 (FIG. 1A) to transmit an uplink signal representing the stored detected electrical state(s) of input pad(s) 12, or the stored representations thereof. Controller 88 can provide the stored data to interface 26 (shown), or interface 26 can retrieve stored values directly from memory 3101.

In various embodiments, controller 88 compares each detection of the electrical state(s) of input pad(s) 12 with the last stored value thereof from memory 3101. Controller 88 updates the contents of memory 3101 only if the electrical state of one or more input pad(s) 12 has changed. This can reduce memory requirements compared to storing every detected electrical state, regardless of whether it has changed.

In some of these embodiments, transceiver 20 includes timer 555 for keeping time. Controller 88 updates memory 3101 by storing the time (from timer 555) at which the change was detected, or the time duration between the change (interval end time measured using timer 555) and the previous change (interval start time stored in memory 3101). Timer 555 can include a crystal, oscillator, real-time-clock, battery backup, or MEMS resonator.

In various embodiments, controller 88 detects the electrical state(s) of input pad(s) 12 at a plurality of different, selected times separated by respective intervals. The respective intervals can be equal. The respective intervals can also be elements of an arithmetic, geometric, logarithmic, or other regular sequence. The respective intervals can also be pseudorandom.

In various embodiments, controller 88 and memory 3101 record the history of system 5 as determined by alterations or modifications to conductors 30, whether through direct human or machine action or by exposure to environmental factors. As desired, system 5 can communicate with reader 89 to report the recorded history. This permits tamper-evident tracking of the final state of system 5, or the product or container to which it is attached, together with stored indications of the time at which state changes happened. This can be used to determine, for example, whether a product spent too long outside a preferred temperature range. In other embodiments, memory 3101 includes one or more fuses 500, part of transceiver 20 or disposed over substrate 10, which are electrically blown to store data in a non-volatile, tamper-evident way.

As discussed above, conductor 30 permits external alteration of its electrical or mechanical state. In various embodiments, external alteration is performed without passing electric current through conductor 30. In various embodiments, conductor 30 in state region 7 changes electrical or mechanical state in response to an environmental factor. Conductor 30 can also change electrical or mechanical state in response to a change in the environmental factor.

In various embodiments, code circuit 16 includes a plurality of conductors 30A, 30B over substrate 10. Each conductor 30 has a respective, different susceptibility to the environmental factor. Each conductor 30 thus changes electrical or mechanical state at a respective, different time. The susceptibilities can be selected so that the respective, different times are elements of an arithmetic, geometric, logarithmic, or other regular sequence. Timer 555 can be used to measure the respective, different times, or the intervals between them. When timer 555 is used, controller 88 stores the measured times or intervals in memory 3101 each time the electrical state of an input pad 12 changes.

In various embodiments, conductor 30 is adapted to change electrical or mechanical state when cut, laser-cut, cracked, displaced, etched, acid-etched, punched, bent, folded, spindled, mutilated, or exploded. In other embodiments, conductor 30 connects first and second pads (e.g., of input pads 12 or output pads 14) on transceiver 20 and is adapted to receive additional conductive material disposed over substrate 10. The new material is electrically connected to the first and second pads. This and other embodiments of alteration are discussed above. In one example, strap 30C is cut along score line 30× to increase the impedance of conductor 30.

Figure 32:
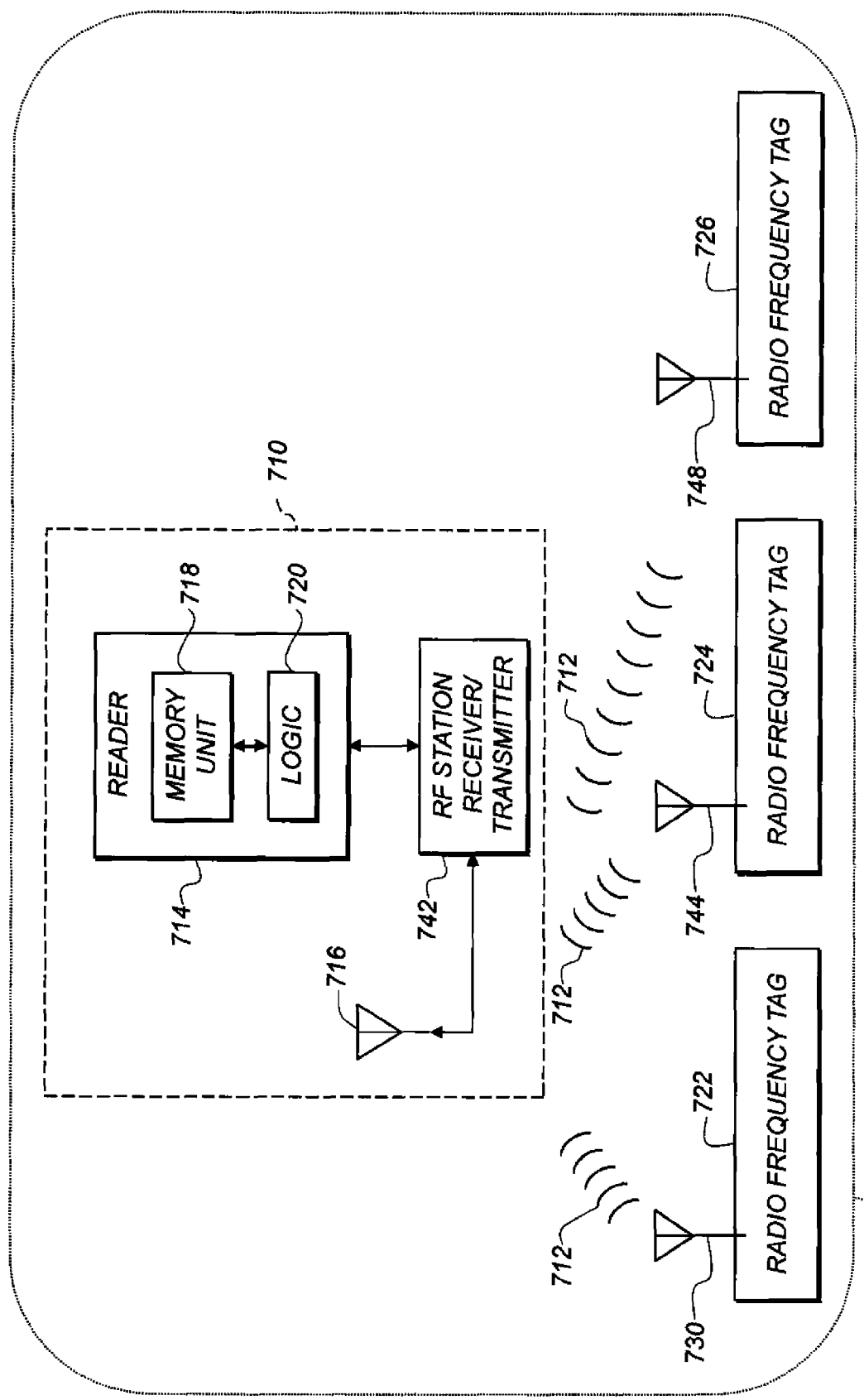
FIG. 32 is a block diagram of an RFID system according to various embodiments.

FIG. 32 is a block diagram of an RFID system according to various embodiments. Base station 710 communicates with three RF tags 722, 724, 726, which can be active or passive in any combination, via a wireless network across an air interface 712. FIG. 32 shows three tags, but any number can be used. Base station 710 includes reader 714, reader's antenna 716 and RF station 742. RF station 742 includes an RF transmitter and an RF receiver (not shown) to transmit and receive RF signals via reader's antenna 716 to or from RF tags 722, 724, 726. Tags 722, 724, 726 transmit and receive via respective antennas 730, 744, 748.

Reader 714 includes memory unit 718 and logic unit 720. Memory unit 718 can store application data and identification information (e.g., tag identification numbers) or SG TINs of RF tags in range 752 (RF signal range) of reader 714. Logic unit 720 can be a microprocessor, FPGA, PAL, PLA, or PLD. Logic unit 720 can control which commands that are sent from reader 714 to the tags in range 752, control sending and receiving of RF signals via RF station 742 and reader's antenna 716, or determine if a contention has occurred.

Reader 714 can continuously or selectively produce an RF signal when active. The RF signal power transmitted and the geometry of reader's antenna 716 define the shape, size, and orientation of range 752. Reader 714 can use more than one antenna to extend or shape range 752.

RFID standards exist for different frequency bands, e.g., 125 kHz (LF, inductive or magnetic-field coupling in the near field), 13.56 MHz (HF, inductive coupling), 433 MHz, 860-960 MHz (UHF, e.g., 915 MHz, RF coupling beyond the near field), or 2.4 GHz. Tags can use inductive, capacitive, or RF coupling (e.g., backscatter) to communicate with readers.

Radio frequency identification systems are typically categorized as either "active" or "passive." In an active RFID system, tags are powered by an internal battery, and data written into active tags can be rewritten and modified. In a passive RFID system, tags operate without an internal power source and are typically programmed with a unique set of data that cannot be modified. A typical passive RFID system includes a reader and a plurality of passive tags. The tags respond with stored information to coded RF signals that are typically sent from the reader. Further details of RFID systems are given in commonly-assigned U.S. Pat. No. 7,969,286 to Adelbert, and in U.S. Pat. No. 6,725,014 to Voegele, both of which are incorporated herein by reference.

In a commercial or industrial setting, tags can be used to identify containers of products used in various processes. A container with a tag affixed thereto is referred to herein as a "tagged container." Tags on containers can carry information about the type of products in those containers and the source of those products. A tag on a container can carry the SGTIN(s) for the item(s) in the container, as described above with reference to FIG. 7.

Figure 33:
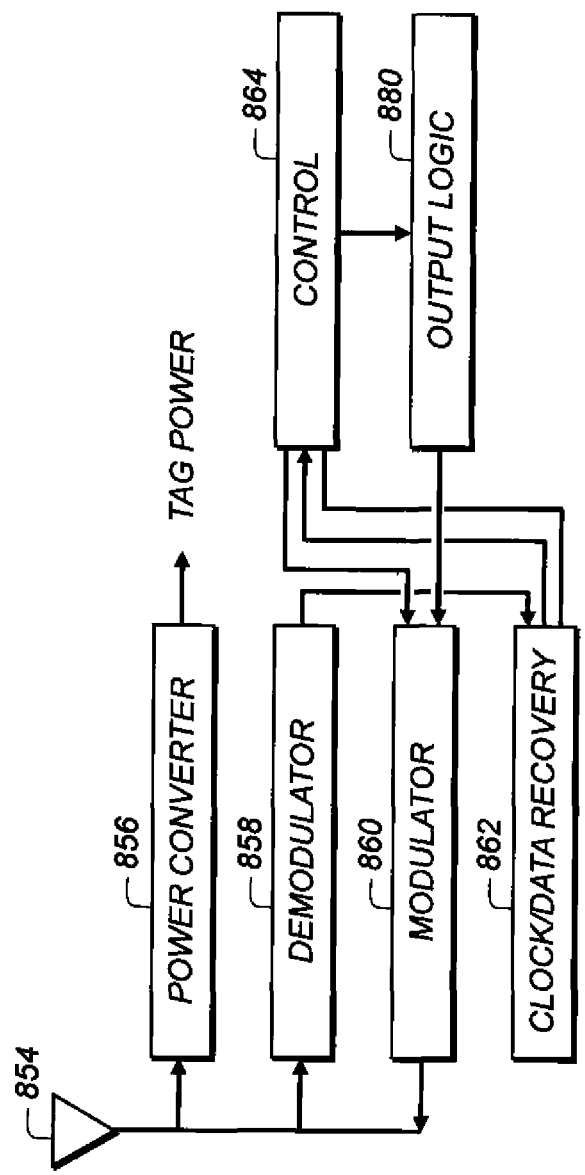
FIG. 33 is a block diagram of a passive RFID tag according to various embodiments. The attached drawings are for purposes of illustration and are not necessarily to scale.

FIG. 33 is a block diagram of a passive RFID tag (e.g., tags 722, 724, 726 shown in FIG. 32) according to various embodiments. The tag can be a low-power integrated circuit, and can employ a "coil-on-chip" antenna for receiving power and data. The RFID tag includes antenna 854 (or multiple antennas), power converter 856, demodulator 858, modulator 860, clock/data recovery circuit 862, control unit 864, and output logic 880. Antenna 854 can be an omnidirectional antenna impedance-matched to the transmission frequency of reader 714 (FIG. 32). The RFID tag can include a support, for example, a piece of polyimide (e.g., KAPTON) with pressure-sensitive adhesive thereon for affixing to packages. The tag can also include a memory (often RAM in active tags or ROM in passive tags) to record digital data, e.g., an SGTIN.

Reader 714 (FIG. 32) charges the tag by transmitting a charging signal, e.g., a 915 MHz sine wave. When the tag receives the charging signal, power converter 856 stores at least some of the energy received by antenna 854 in a capacitor, or otherwise stores energy to power the tag during operation.

After charging, reader 714 transmits an instruction signal by modulating onto the carrier signal data for the instruction signal, e.g., to command the tag to reply with a stored SGTIN. Demodulator 858 receives the modulated carrier bearing those instruction signals. Control unit 864 receives instructions from demodulator 858 via clock/data recovery circuit 862, which can derive a clock signal from the received carrier. Control unit 864 determines data to be transmitted to reader 714 and provides it to output logic 880. For example, control unit 864 can retrieve information from a laser-programmable or fusible-link register on the tag. Output logic 880 shifts out the data to be transmitted via modulator 860 to antenna 854.

The tag can also include a cryptographic module (not shown). The cryptographic module can calculate secure hashes (e.g., SHA-1) of data or encrypt or decrypt data using public- or private-key encryption. The cryptographic module can also perform the tag side of a Diffie-Hellman or other key exchange.

Signals with various functions can be transmitted; some examples are given in this paragraph. Read signals cause the tag to respond with stored data, e.g., an SGTIN. Command signals cause the tag to perform a specified function (e.g., kill). Authorization signals carry information used to establish that the reader and tag are permitted to communicate with each other.

Passive tags typically transmit data by backscatter modulation to send data to the reader. This is similar to a radar system. Reader 714 continuously produces the RF carrier sine wave. When a tag enters the reader's RF range 752 (FIG. 32; also referred to as a "field of view") and receives, through its antenna from the carrier signal, sufficient energy to operate, output logic 880 receives data, as discussed above, which is to be backscattered.

Modulator 860 then changes the load impedance seen by the tag's antenna in a time sequence corresponding to the data from output logic 880. Impedance mismatches between the tag antenna and its load (the tag circuitry) cause reflections, which result in momentary fluctuations in the amplitude or phase of the carrier wave bouncing back to reader 714. Reader 714 senses occurrences and timing of these fluctuations and decodes them to receive the data clocked out by the tag. In various embodiments, modulator 860 includes an output transistor (not shown) that short-circuits the antenna in the time sequence (e.g., short-circuited for a 1 bit, not short-circuited for a 0 bit), or opens or closes the circuit from the antenna to the on-tag load in the time sequence. In another embodiment, modulator 860 connects and disconnects a load capacitor across the antenna in the time sequence. Further details of passive tags and backscatter modulation are provided in U.S. Pat. No. 7,965,189 to Shanks et al. and in "Remotely Powered Addressable UHF RFID Integrated System" by Curty et al., IEEE Journal of Solid-State Circuits, vol. 40, no. 11, November 2005, both of which are incorporated herein by reference. As used herein, both backscatter modulation and active transmissions are considered to be transmissions from the RFID tag. In active transmissions, the RFID tag produces and modulates a transmission carrier signal at the same wavelength or at a different wavelength from the read signals from the reader.

Voltage values associated with a ground signal or a voltage signal can be chosen to suit the needs of the integrated circuits, power supplies, and other electronic elements. The present invention is not limited to any particular voltage ranges or differences, either positive or negative, used to provide power, excitation signals, or detection signals. For example, a negative voltage V− can be used with a ground signal as well as a positive voltage V+.

The invention is inclusive of combinations of the embodiments described herein. References to "a particular embodiment" and the like refer to features that are present in at least one embodiment of the invention. Separate references to "an embodiment" or "particular embodiments" or the like do not necessarily refer to the same embodiment or embodiments; however, such embodiments are not mutually exclusive, unless so indicated or as are readily apparent to one of skill in the art. The use of singular or plural in referring to the "method" or "methods" and the like is not limiting. The word "or" is used in this disclosure in a non-exclusive sense, unless otherwise explicitly noted.

The invention has been described in detail with particular reference to certain preferred embodiments thereof, but it will be understood that variations, combinations, and modifications can be effected by a person of ordinary skill in the art within the spirit and scope of the invention.

PARTS LIST 5 electronic storage system
7 state region
8, 8E alteration region
9 detection region
10 substrate
11 planarization layer
12, 12R input pad
13 seal
14, 14G, 14P output pad
15 topcoat
16 code circuit
18 container
20 transceiver
21 transceiver substrate
22 excitation circuit
24 detection circuit interface
26 antenna
30, 30A, 30B conductor
30C, 30C1, 30C2 strap
30D sites
30G conductor
30P conductor
30R, 30R1, 30R2, 30R3, 30R conductor
30W1, 30W2, 30W3, 30W4 conductor
30X score line
31 open site
32, 32A, 32B, 32C, 32D, 32E resistor
40 insulating layer
56 electrical connector
57 electrode
60 overlapping intersection
74 security circuit
80 downlink signal
82 uplink signal
86 circuit template
88 controller
89 reader
90, 90A, 90B removable portion
92 remaining portion
94 perforation
97 detection portion
100 receive substrate step
110 form conductors step
111 connect pads step
112 deposit conductive ink step
114 cure conductive ink step
116 form circuit template step
118 apply circuit template step
119 dispose antenna step
120 position transceiver step
121 form electronic storage system step
122 test transceiver step
125 read information step
130 convey package step
135 read information step
140 modify information step
145 expose package step
200 send downlink signal step
205 receive downlink signal step 210 excite code circuit step
215 detect state(s) step
220 transmit signal representing state(s) step
225 alter code circuit step
230 receive uplink signals step
235 compare uplink signals step
310 chamber
320 environment
400 receive substrate step
420 affix transceiver step
430 dispose conductor step
432 deposit inks step
434 dispose foil step
440 connect transceiver step
450 seal code circuit step
460 dispose plurality of conductors step
465 seal chamber step
467 fill chamber with nitrogen step
469 draw vacuum in chamber step
500 fuse
555 timer
710 base station
712 air interface
714 reader
716 reader's antenna
718 memory unit
720 logic unit
722, 724, 726 RFID tag
730, 744, 748 antenna
742 RF station
752 range
854 antenna
856 power converter
858 demodulator
860 modulator
862 clock/data recovery circuit
864 control unit
880 output logic
3101 memory

The invention claimed is:

1. Method of making an electronic storage system, the method comprising:
   receiving a substrate;
   receiving a transceiver including a transceiver substrate separate from the substrate, an output electrical-connection pad, and a plurality of input electrical-connection pads;
   receiving a circuit template separate from the substrate and from the transceiver, the circuit template including patterned conductive material forming a plurality of conductors;
   a transceiver-disposing step of disposing the transceiver over the substrate;
   a template-disposing step of disposing the circuit template over the substrate so that at least one of the plurality of conductors of the circuit template is electrically connected to the output electrical-connection pad and at least one of the plurality of conductors of the circuit template is electrically connected to each of the plurality of input electrical-connection pads; and
   printing at least one electrically-conductive strap on the substrate or circuit template so that each strap electrically connects the output electrical-connection pad to the at least one of the plurality of input electrical-connection pads through at least two of the plurality of conductors of the circuit template and leaving at least one open site between conductors; and
   wherein at least one of the plurality of conductors has an environmentally modifiable electrical state.

2. The method according to claim 1, wherein the transceiver further includes a plurality of output electrical-connection pads, at least one of the plurality of conductors of the circuit template is electrically connected to each of the plurality of output electrical-connection pads, and the at least one electrically-conductive strap is printed so that each strap electrically connects at least one of the plurality of output electrical-connection pads to at least one of the plurality of input electrical-connection pads.

3. The method according to claim 1, wherein:
   the transceiver further includes an interface, an excitation circuit connected to the output electrical-connection pad, and a detection circuit connected to at least one of the plurality of input electrical-connection pads;
   and the method further includes:
      receiving a downlink signal using the interface;
      in response to the downlink signal, providing an excitation signal to the output electrical-connection pad using the excitation circuit;
      detecting respective electrical state(s) of the at least one of the plurality of input electrical-connection pad(s) in response to the excitation signal using the detection circuit; and
      transmitting an uplink signal representing the respective electrical state(s) of at least some of the plurality of input electrical-connection pads using the interface.

4. The method according to claim 3, wherein:
   the excitation signal is a query signal provided on the output electrical-connection pad, the query signal having a first voltage or current at a first point in time and a second, different voltage or current at a second, later point in time; and
   the detection circuit is adapted to measure a voltage or current of at least one of the plurality of input electrical-connection pads electrically connected through a code circuit to the output pad to provide the respective electrical state(s) of the at least one of the plurality of input electrical-connection pads.

5. The method according to claim 3, wherein the detection circuit includes an A/D converter to measure a voltage of the at least one of the plurality of input electrical-connection pads.

6. The method according to claim 3, wherein the transceiver includes read circuitry having a plurality of voltage thresholds so that a voltage of the at least one of the plurality of input electrical-connection pads corresponds to more than one bit of information.

7. The method according to claim 3, wherein the respective electrical state(s) of the at least one of the plurality of input electrical-connection pads correspond to a plurality of bits of information in the uplink signal.

8. The method according to claim 1, wherein the template-disposing step is performed before the transceiver-disposing step, and the transceiver-disposing step includes disposing the transceiver pad-down over the template disposed over the substrate.

9. The method according to claim 1, wherein the template-disposing step includes adhering the circuit template to the substrate.

10. The method according to claim 1, wherein the circuit template is formed from conductive foil.

11. The method according to claim 1, wherein the plurality of conductors are composed of conductive inks.

12. The method according to claim 1, wherein the plurality of conductors include conductive particles and non-conductive binder particles.

13. The method according to claim 1, wherein the transceiver is an RFID transceiver, further including disposing an antenna disposed over the substrate connected to the transceiver.

\* \* \* \* \*